United States Patent
Smith et al.

(10) Patent No.: US 6,208,136 B1
(45) Date of Patent: Mar. 27, 2001

(54) METHOD OF AND APPARATUS FOR NUCLEAR QUADRUPOLE RESONANCE TESTING A SAMPLE, AND PULSE SEQUENCE FOR EXCITING NUCLEAR QUADRUPOLE RESONANCE

(75) Inventors: John Alec Sydney Smith, London; Neil Francis Peirson, Northampton, both of (GB)

(73) Assignee: BTG International Limited, London (GB)

(*) Notice: Subject to any disclaimer, the term of this patent is extended or adjusted under 35 U.S.C. 154(b) by 0 days.

(21) Appl. No.: 08/916,374

(22) Filed: Aug. 22, 1997

Related U.S. Application Data

(63) Continuation of application No. PCT/GB96/00422, filed on Feb. 23, 1996.

(30) Foreign Application Priority Data

Feb. 24, 1995 (GB) .................................. 9503807
Mar. 29, 1995 (GB) .................................. 9506468

(51) Int. Cl.[7] ............................................. G01V 3/00
(52) U.S. Cl. ............................. 324/300; 324/314
(58) Field of Search ..................... 324/300, 314, 324/307, 309, 318

(56) References Cited

U.S. PATENT DOCUMENTS

| 4,438,400 | 3/1984 | Patt .................................. 324/300 |
| 5,365,171 | 11/1994 | Buess et al. ......................... 324/307 |
| 5,521,504 | * 5/1996 | Cory et al. ........................... 324/309 |

FOREIGN PATENT DOCUMENTS

| 0 098 479 | 1/1984 | (EP) . |
| 0 135 847 | 4/1985 | (EP) . |
| 0 145 277 | 6/1985 | (EP) . |
| 0 155 052 | 9/1985 | (EP) . |
| 0 204 569 | 12/1986 | (EP) . |
| 1 334 819 | 10/1973 | (GB) . |
| 2 200 462 | 8/1988 | (GB) . |
| 2 254 923 | 10/1992 | (GB) . |
| 2 255 830 | 11/1992 | (GB) . |
| 2 262 610 | 6/1993 | (GB) . |
| 2 282 666 | 4/1995 | (GB) . |
| 2 284 898 | 6/1995 | (GB) . |
| 2 286 248 | 8/1995 | (GB) . |
| 92/17793 | 10/1992 | (WO) . |
| 92/17794 | 10/1992 | (WO) . |
| 94/12891 | 6/1994 | (WO) . |

OTHER PUBLICATIONS

Freeman et al., "Phase and Intensity Anomalies in Fourier Transform NMR", Journal of Magnetic Resonance, 1971, pp. 366–383.

(List continued on next page.)

*Primary Examiner*—Louis Arana
(74) *Attorney, Agent, or Firm*—Pillsbury Madison & Sutro LLP

(57) ABSTRACT

A method of nuclear quadrupole resonance testing a sample comprising a first type substance containing quadrupolar nuclei and a second type substance which may give rise to spurious signals which interfere with response signals from the quadrupolar nuclei, comprises applying a pulse sequence to the sample to excite nuclear quadrupole resonance, the pulse sequence comprising at least one pair of pulses; detecting response signals; and comparing, for the or each such pair, the respective response signals following the two member pulses of the pair, the pulse sequence being such that the respective spurious signals following the two member pulses can be at least partially cancelled by the comparison without the corresponding true quadrupole resonance signals being completely cancelled; and for the or each such pair, the two member pulses being of like phase.

50 Claims, 22 Drawing Sheets

OTHER PUBLICATIONS

Vega, "Theory of $T_1$ Relaxation Measurements in Pure Nuclear Quadrupole Resonance for Spins $/=1$", Journal of Chemical Physics, vol. 61, No. 3, 1974, pp. 1093–1100.

Furo et al., "2D Quadrupolar–Echo Spectroscopy With Coherence Selection and Optimized Pulse Angle", Journal of Magnetic Resonance, 1992, pp. 388–407.

Bielecki et al., "Zero–Field NMR and MQR Spectrometer", Rev. Sci. Instrum., 1986, pp. 393–403.

Vollmers et al., "A Method of Measuring the Initial Behavior of the Free Induction Decay", Journal of Magnetic Resonance, 1978, pp. 33–50.

Singh et al., "Application of the Zero–Time Resolution Technique to Nuclear Quadrupole Resonance", Journal of Magnetic Resonance, 1988, pp. 538–554.

Reddy et al., "Multiple–Pulse Investigations in Pure NQR Spectroscopy: Influence of Spin–Locking and Phase Alternated Pulse Sequence (PAPS) on Polycrystalline Samples Containing $^{35}Cl(I=3/2)$ Nuclei", Journal of Molecular Structure, 1989, pp. 345–354.

Weisman et al., "Quadrupolar Echoes in Solids", Physical Review, vol. 181, No. 3, 1969, pp. 1341–1350.

Osokin, "Pulsed Line Narrowing in Nitrogen–14 NQR", Phys. Stat. Sol, 1980, pp. 681–686.

Osokin, "Pulsed Spin Locking in Nuclear Quadrupole Resonance of $^{14}N$", Sov. Phys. JETP 57, 1983, pp. 69–71.

Belton, "Experimental Sulphur–33 Nuclear Magnetic Resonance Spectroscopy", J. Chem. Soc., 1985, pp. 63–75.

Hirschfeld, "Short Range Remote NQR Measurements", Journal of Molecular Structure, 1980, pp. 63–77.

"Driven Equilibrium Fourier Transform Spectroscopy", Journal of the Americal Chemical Society, 1969, pp. 7784–7785.

Buess et al., "NQR Detection Using a Meanderline Surface Coil", Journal of Magnetic Resonance, 1991, pp. 348–362.

Ageev et al., "Composite Pulses in Nuclear Quadrupole Resonance", Molecular Physics, vol. 83, No. 2, 1994, pp. 193–210.

Ramamoorthy et al., "Design of Composite Pulses For Nuclear Quadrupole Resonance Spectroscopy", Journal of Molecular Structure, 1989, pp. 333–344.

Ramamoorthy et al., "Numerical Design of Composite Pulses For Polycrystalline Samples in Pulsed NQR Spectroscopy", 1990, pp. 581–586.

Patt, "Pulse Strategies For the Suppresion of Acoustic Ringing", Journal of Magnetic Resonance, 1982, pp. 161–163.

Zhang et al., "Elimination of Ringing Effects in Multiple–Pulse Sequences", Chemical Physics Letters, vol. 173, No. 5.6, 1990, pp. 481–484.

Journal of Magnetic Resonance, vol. 78, 1988, Duluth, USA, pp. 538–554, XP002009771 G.A.Singh et al "Application of the Zero–time resolution technique to nuclear quadrupole resonance".

Journal of Magnetic Resonance, vol. 30, 1978, pp. 33–50 XP000578507 K.W. Vollmers et al: "A method of measuring the initial behavior of the free induction decay".

\* cited by examiner

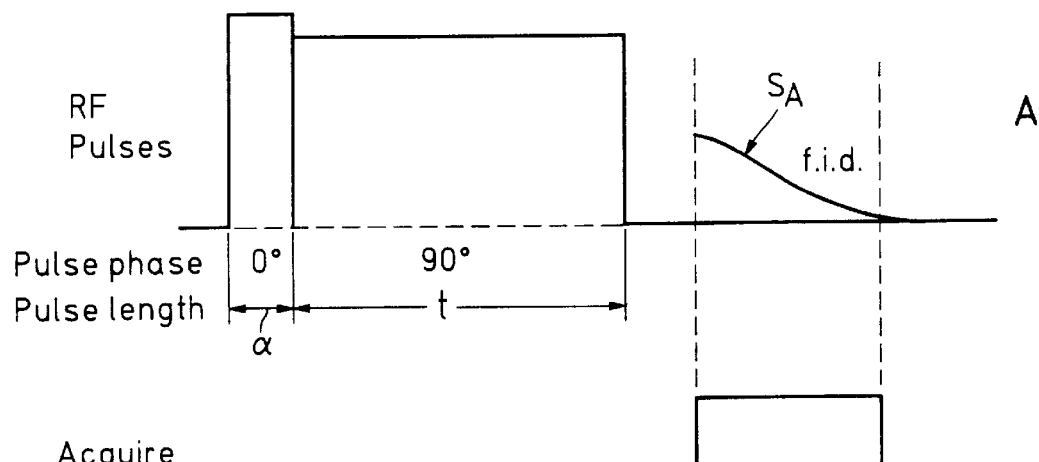
Fig.2a(i)
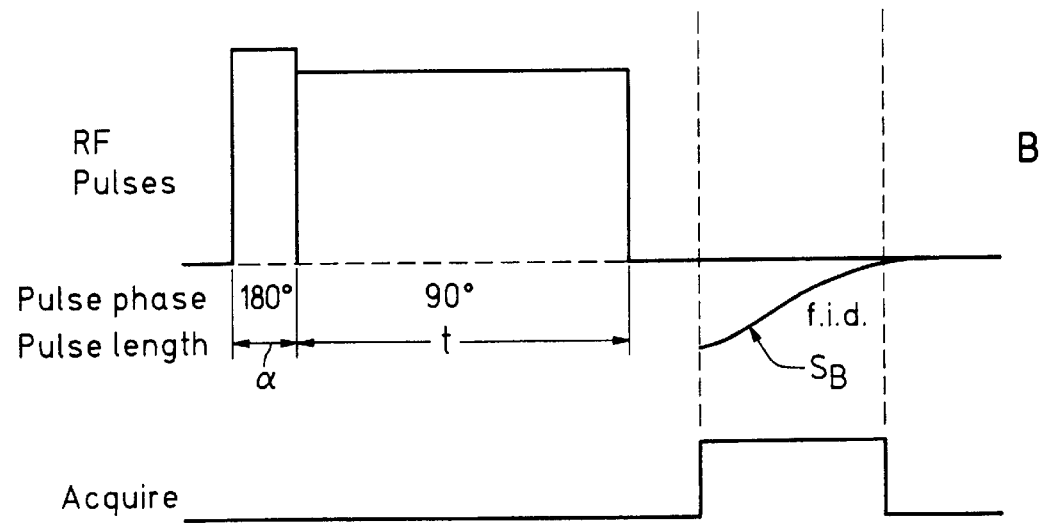
Fig.2a(ii)

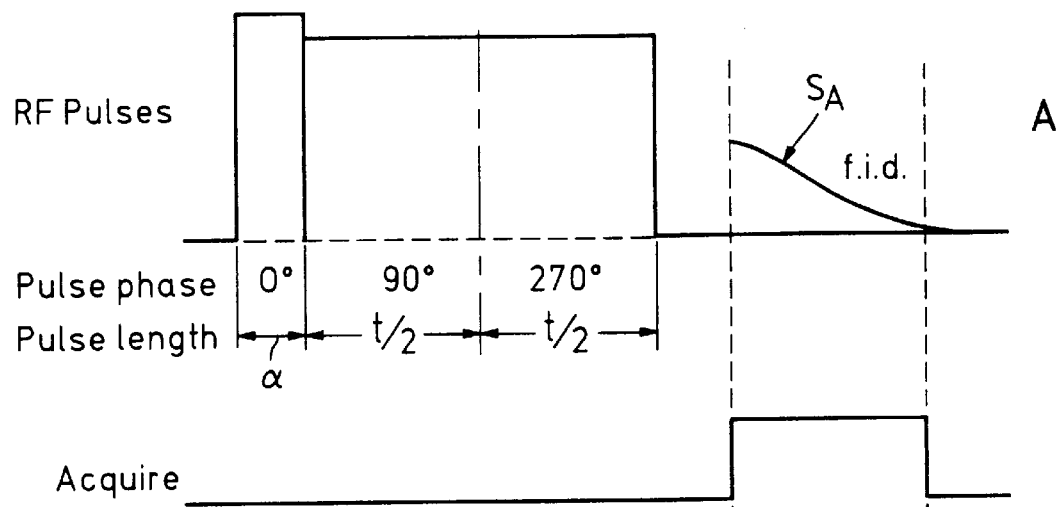
Fig.2b(i)
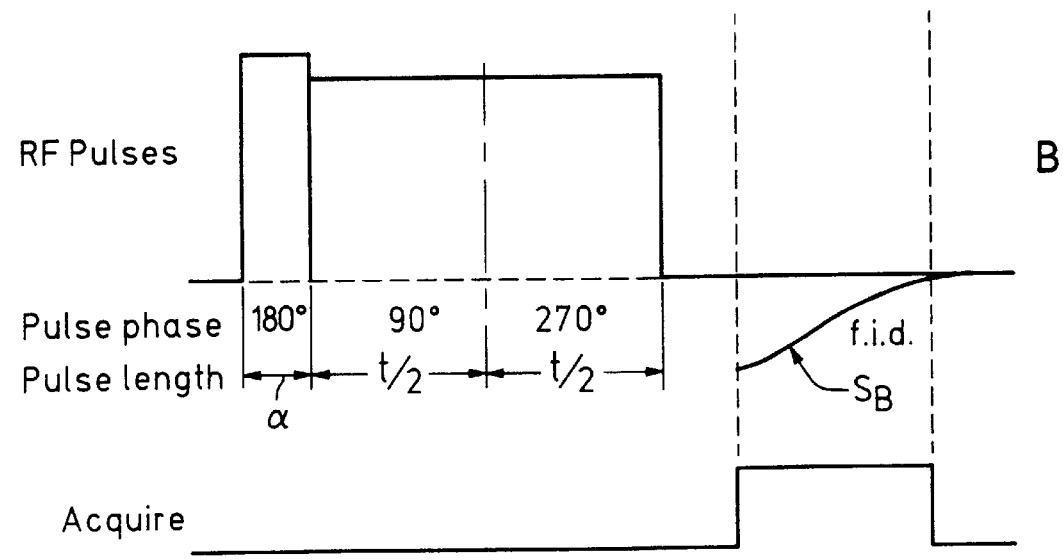
Fig.2b(ii)

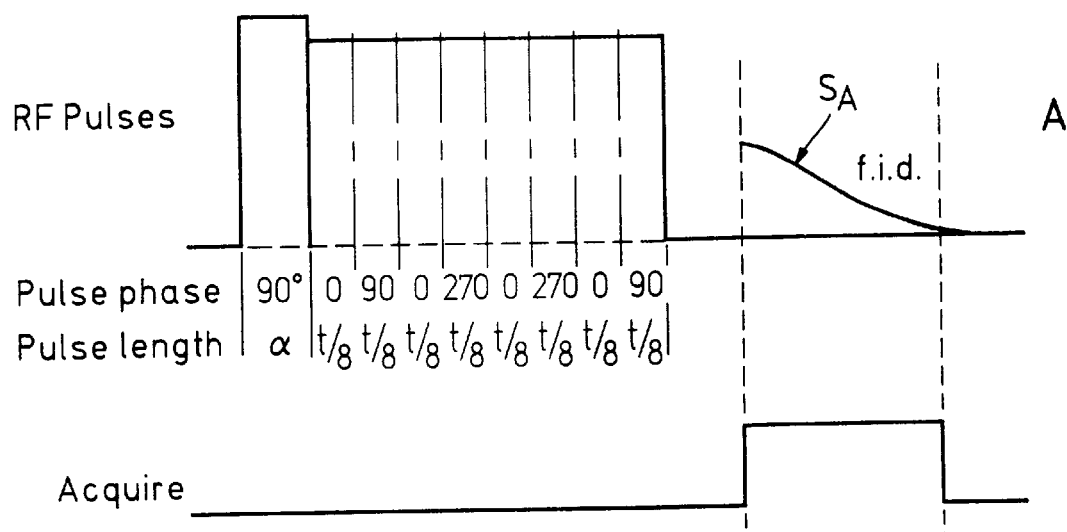
Fig.2c(i)
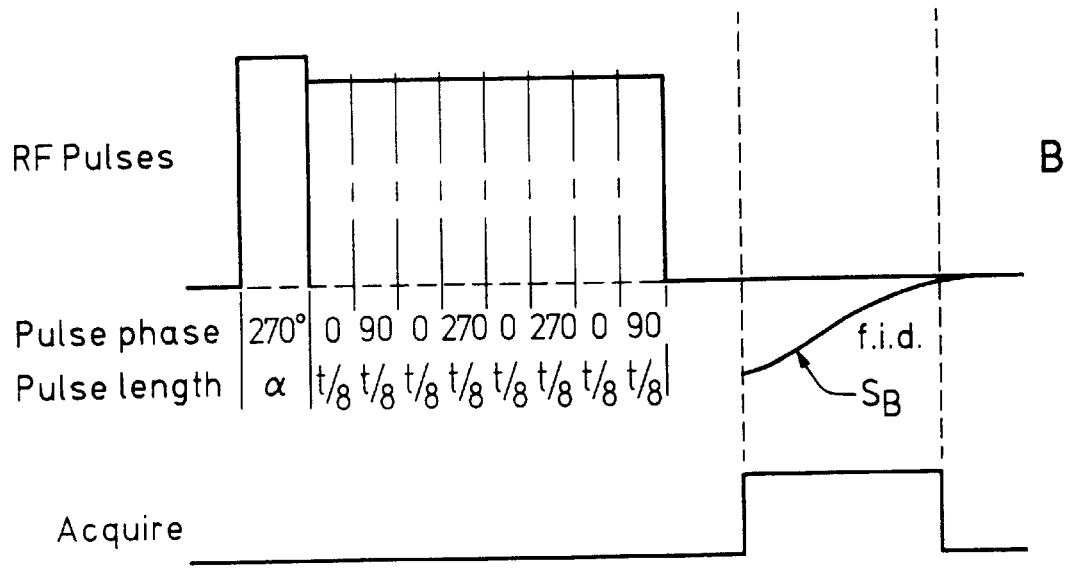
Fig.2c(ii)

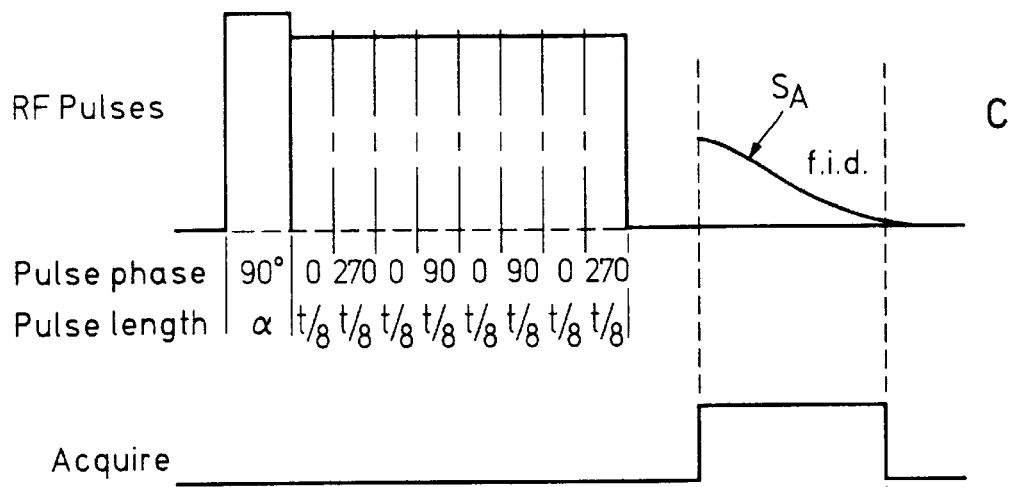
Fig.2d(i)
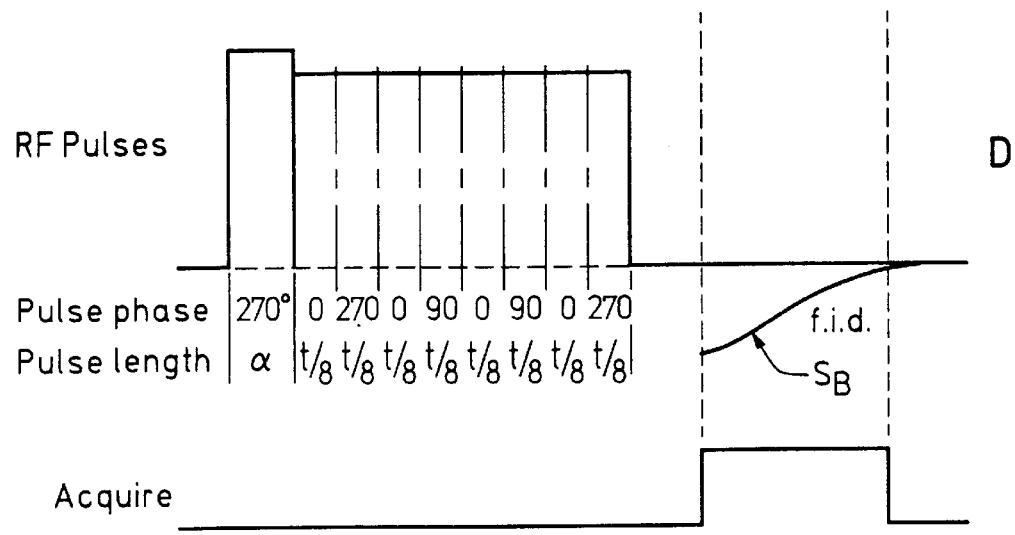
Fig.2d(ii)

METHOD OF AND APPARATUS FOR NUCLEAR QUADRUPOLE RESONANCE TESTING A SAMPLE, AND PULSE SEQUENCE FOR EXCITING NUCLEAR QUADRUPOLE RESONANCE

This application is a continuation of PCT/GB96/00422 filed Feb. 23, 1996.

The present invention relates to a method of and apparatus for nuclear quadrupole resonance testing a sample, as well as to a pulse sequence for exciting nuclear quadrupole resonance (NQR). The invention has particular application to the detection of the presence of a given substance in a sample. The sample may contain or be suspected of containing nuclei of integral or half-integral spin quantum number ($I \geq \frac{1}{2}$).

NQR testing is used for detecting the presence or disposition of specific substances. It depends on the energy levels of quadrupolar nuclei, which have a spin quantum number I greater than $\frac{1}{2}$, of which $^{14}N$ is an example (I=1). $^{14}N$ nuclei are present in a wide range of substances, including animal tissue, bone, food stuffs, explosives and drugs. One particular use of the technique of the present invention is in the detection of the presence of substances such as explosives or narcotics. The detection may be of baggage at airports, or of explosives or drugs concealed on the person or buried underground or elsewhere.

In conventional Nuclear Quadrupole Resonance testing a sample is placed within or near to a radio-frequency (r.f) coil and is irradiated with pulses or sequences of pulses of electro-magnetic radiation having a frequency which is at or very close to a resonance frequency of the quadrupolar nuclei in a substance which is to be detected. If the substance is present, the irradiant energy will generate a precessing magnetization which can induce voltage signals in a coil surrounding the sample at the resonance frequency or frequencies and which can hence be detected as a free induction decay (f.i.d.) during a decay period after each pulse or as an echo after two or more pulses. These signals decay at a rate which depends on the time constants $T_2^*$ for the f.i.d., $T_2$ and $T_{2e}$ for the echo amplitude as a function of pulse separation, and $T_1$ for the recovery of the original signal after the conclusion of the pulse or pulse sequence.

As described in U.S. Pat. No. 5,365,171 (Buess et al.), spurious interfering signals (also termed "ringing") may sometimes arise from a sample during NQR tests which are not associated directly with or due to the nuclear resonance.

For example, one group of materials which can cause interference problems includes metallic conductors. Such materials may be commonly found in many types of objects in baggage. It has been discovered that the interference may be particularly pronounced when a sample includes metallic or ferromagnetic material as a layer of plating on another material, especially, it has been found, when the plating layer comprises Nickel. Objects which are particularly prone to such problems include screws or key-rings. The cause of this type of interference has not been proven, but it is believed to emanate from ferromagnetic or like resonance effects in the $B_1$ field of the sample coil, and be due to a form of magneto-acoustic ringing. It should be emphasised that this interference is not an artefact of the particular detection apparatus used, but a feature of the material itself. Also it will be understood that, in the context of the detection of the presence of a particular substance in a sample, it would usually not be the particular nuclear species to be detected but the remainder of the sample which would give rise to the interfering signals.

Included in the first group as a special case are magnets and magnetic materials. Such magnets can cause interference effects similar to those described in the preceding paragraph.

A further group of materials which can cause interference problems includes substances such as piezoelectric substances which may give rise to mechanical resonances. For instance, the silica in sand can produce interference at an r.f. frequency of 5 MHz.

Furthermore, it is to be noted that the above substances, as well as many others, may give rise to other interference problems than the spurious interfering signals referred to above. Particularly, they may alter the loading of the r.f. probe used to detect the nuclear response signals. Hence the probe may need to be re-tuned and/or have its quality factor adjusted according to the nature of the sample being tested.

The spurious interfering signals (or "artefacts") commonly have decay characteristics very similar to those of true NQR-signals, and, furthermore, are often many times stronger; they can last for several milliseconds. The phase of those interfering signals and that of the resonance response signal following a single radio-frequency excitation pulse are entirely determined by the r.f. phase within the pulse. There is, however, one important distinction. When two or more pulses are used, the phase of the NQR response signal, whether it be a free induction decay (f.i.d.) or an echo, depends on the relative phases of the two preceding pulses, unlike that of the interfering signal, which is determined almost entirely by that of the immediately preceding pulse.

This distinction has been exploited in the aforementioned United States patent in an attempt to remove the interfering signal from an NQR response signal. The proposed solution involves the continuous use of phase alternating excitation pulses and the addition or subtraction of the response signals from the various pulses, which has the effect of reducing the spurious signals.

Whilst the afore-mentioned United States patent also describes a solution to the problem of spurious ringing, it has been found in practice that this solution may lack versatility, in that it is restricted to the use of one particular phase alternating pulse sequence. This sequence may not be the most favourable in all circumstances.

Indeed, and in particular, the technique proposed in this United States patent has been found to have the limitation that the separation between adjacent pulses in the phase-alternated sequence which is employed must be longer than the decay time of the interfering signal. If, contrary to the teachings of this patent, the interfering signal generated in response to a first pulse were to persist through to a subsequent pulse of different phase and be detected subsequent to that pulse, a portion of the interfering signal, rather than being subtracted out from the response signal, would actually be added to the signal. This imposes very severe restraints on the sensitivity of the technique.

Also, the technique proposed in the United States patent has been found not to be capable of completely cancelling all spurious instrumental artefacts, such as errors in the phases of the excitation pulses.

The present invention seeks to solve these and other problems.

According to the present invention, there is provided a method of nuclear quadrupole resonance testing a sample comprising a first type substance containing quadrupolar nuclei and a second type substance which may give rise to spurious signals which interfere with response signals from the quadrupolar nuclei, comprising:

applying a pulse sequence to the sample to excite nuclear quadrupole resonance, the pulse sequence comprising at least one pair of pulses;

detecting response signals; and comparing, for the or each such pair, the respective response signals following the two member pulses of the pair;

the pulse sequence being such that the respective spurious signals following the two member pulses can be at least partially cancelled by the comparison without the corresponding true quadrupole resonance signals being completely cancelled; and for the or each such pair, the two member pulses being of like phase.

By the feature of the two member pulses being of like phase (the principle of "phase equivalence"), for each such pair, the present invention can cancel the spurious signals significantly more effectively than has been possible hitherto.

By "like phase" is preferably meant that the phases differ by less than 90°, preferably by less than 45 or 30 or 15 or even 5°.

It will be understood that references in the present specification to phases differing or being equal equates to references to frequency differing or being equal, in that a change in phase implies an at least momentary change in frequency and vice versa.

The member pulses of the pairs are not necessarily or even usually adjacent each other. They may in fact either be corresponding pulses in different individual pulse sequences, or they may be different pulses in the same pulse sequence.

Usually many pairs of pulses would be provided. Since the various pairs of pulses may be applied at very different times, the comparison step may be achieved using stored representations of the relevant signals.

Preferably, for each such pair of pulses, a respective pulse preceding (not necessarily immediately preceding) each member pulse of the pair is of differing phase. This is a convenient way of ensuring that the spurious signals at least partially cancel. By differing phase is preferably meant that the phases differ by at least 90°, preferably by at least 135°, and more preferably by up to 180°. Other ways of arranging the NQR response signals to differ so that the spurious signals can be cancelled are also available, such as the use of a train of saturation pulses before one member of the pair, or inversion of the magnetization before that one member of the pair.

Preferably, at least one of the pairs of pulses is of a first type, and at least one of the pairs of pulses is of a second type, corresponding to each first type, but having cycled phases.

Phase cycling is an important feature of the present invention. This can assist not only in the removal of interfering signals, but also in the removal of baseline drift and error, as well as in the solution of problems caused by minor imperfections such as phase errors in the individual excitation pulses.

A phase cycling technique commonly termed "Cyclops" is known in the NMR field. However, this technique is not closely related to the present technique; in particular, it would not be capable of removing interfering signals.

In one preferred variant of the phase cycling feature, if first and second individual pulse sequences are provided, and if the first and second individual pulse sequences together form a first pair of such sequences, an additional, second pair of individual pulse sequences is provided, and the phases of the respective next pulses following each initial pulse in the second pair differ from the phases of the corresponding pulses in the first pair. The phases of the two respective initial pulses of the second pair of individual pulse sequences may be in quadrature with the phases of the corresponding pulses in the first pair. Apart from a different set of phases for each pair, the corresponding pulse sequences in the different pairs are preferably identical.

The invention provides variants of the phase cycling technique in which either two or four pairs of individual pulse sequences are provided, with appropriate cycling of the phases of the various pulses through the 360° range. More generally, if n pairs of individual pulse sequences are provided, preferably the respective next pulses following the initial pulse in the corresponding individual sequences in each pair have phases which are equally distributed through a 360° range. Preferably, n is 2 or 4, but it may take other values, such as 6 or 8.

Another important preferred feature of the invention is that, for each such pair of pulses, the times between the respective pulse preceding each member pulse of the pair and the detection in the detection step of the respective response signal following each member pulse of the pair are sufficient for the spurious signals to decay to below 50% preferably below 30, 20 or 10%) of their initial value by the end of said times. Preferably also, for each individual pulse sequence (if provided) there is a delay of a predetermined duration between the end of the initial pulse and the beginning of the detection for that sequence.

By judicious choice of the time or delay duration, this can afford a convenient additional technique for removing or reducing the spurious signal. As demonstrated later, introduction of such a time or delay need not interfere with the proper functioning of the remainder of the pulse sequence.

The time or delay is preferably sufficient to, more preferably only just sufficient to, substantially filter out the interfering signal.

In the preferred embodiments, if two individual pulse sequences are provided, for each individual pulse sequence the detection for that sequence only begins subsequent to the end of the next pulse following the initial pulse. This has been found to be a particularly convenient way of putting the present invention into effect. Firstly, it is a simple way of achieving the requisite delay. Secondly, it is not in any event usually appropriate to acquire signals following the initial pulse, for the very reason that for such signals it may not be possible to distinguish between interfering signals and the true nuclear resonance response.

Another important preferred feature is that the pulse sequence comprises first and second individual pulse sequences, each including an initial pulse followed, in the case of the first individual pulse sequence, by one respective member pulse of each pair, and, in the case of the second individual sequence, by the other respective member pulse of each pair, the initial pulses of the first and second individual sequences differing as to phase.

By determining the phase of the excitation, using the initial pulses, during the initial portion of each individual pulse sequence, rather than later in the sequence, the present invention can afford considerable versatility as to what pulse sequence may be chosen to follow the initial pulse. Also, by changing the phase during the initial portion of the sequence, there need be no lower limit to the separation between the various subsequent pulses of which each sequence is composed. This can afford a substantially more sensitive test than has hitherto been available, especially (as will be demonstrated later) where low flip angles are being used.

According to the feature just described, there is preferably provided a method of nuclear resonance testing a sample, comprising: applying a pulse sequence to the sample to excite nuclear resonance, the sequence comprising first and second individual pulse sequences, each including an initial pulse followed by at least one further pulse, the respective initial pulses in the first and second individual sequences differing as to phase; and detecting the respective signals generated in response to the first and second individual sequences.

The respective initial pulses in the first and second individual sequences are suitably in antiphase, to enable a substantially complete elimination of the interfering signal, but are preferably otherwise identical.

The initial pulses may be thought of as preparation pulses (following which signals are not usually acquired), typically having different characteristics from the remaining pulses in the sequence. For example, and perhaps most importantly, each initial pulse preferably has a different phase from any further pulse which follows it in the same individual sequence. This has been found to be an important feature in obtaining sensitive test results. It is particularly preferred that the phase of the initial pulse is in quadrature with the phase of the next pulse in the sequence, since this has been found to be the optimal phase relationship between the two pulses.

More usually, neither of the initial pulses have the same phase as any further pulse in either individual sequence. However, this feature may not always be necessary. For instance, a phase-alternated sequence as suggested in U.S. Pat. No. 5,365,171 could be used in combination with an initial preparatory pulse of different phase, for both the first and second individual pulse sequences. One advantage this would have over the U.S. patent would be more or less complete removal of instrumental artefacts.

A further preferred feature is that, if, as may be advantageous, a plurality of further pulses are provided in each individual sequence, each such further pulse in the same sequence has the same phase. This is an important feature for two reasons. Firstly, it can render the invention simpler to put into practice. Secondly, and perhaps more significantly, it can enable the accumulation of signals from each of the further pulses in a way which can reinforce the nuclear resonance signal whilst eliminating the interfering signal.

In the preferred embodiments, the two initial pulses differ in phase by 180°, whilst all the further pulses have a phase which is in quadrature with that of the initial pulses.

Preferably, the pulse sequence includes (at least) a first pulse and a second pulse, the second pulse at least partially locking the magnetization (of the quadrupolar nuclei) generated by the first pulse. Such a sequence may be termed a "spin locking" sequence, with the magnetization being locked for a time longer than would be achievable with the equivalent single pulse. Locking can be achieved by keeping the $B_1$ field parallel to the magnetization, which can require that the second pulse differs in phase from the first pulse by between roughly 45 and 180°, preferably 70 and 135°, and more preferably 80 and 110°. The spin locking sequence has the important advantage of being able to lock the magnetization beyond (even beyond 2, 3 or 5 times) the free induction decay time, $T_2^*$ of the first pulse, or indeed possibly beyond the spin spin relaxation time $T_2$. At least the magnetization is locked for some fraction, say $\frac{1}{10}$, $\frac{1}{4}$ or $\frac{1}{2}$, of $T_2^*$.

In a first preferred embodiment the time between the first and second pulses is less than the length of the second pulse. The time between the first and second pulses is usually small, less than, and preferably less than 50% or less than 25% of, the length of either the first or the second pulse. The time is actually preferably zero or as close to zero as possible; that is, the pulses are preferably contiguous. Each of the first and second pulses may themselves comprise a plurality of pulses or pulse elements.

This important feature is provided independently. Hence, according to a closely related aspect of the present invention, there is provided a method of nuclear quadrupole resonance testing a sample containing quadrupolar nuclei, comprising:

applying a pulse sequence to the sample to excite nuclear quadrupole resonance, the pulse sequence comprising at least a first pulse and a second pulse, the spacing between the first and second pulses being less than the length of the second pulse, the second pulse at least partially locking the magnetization generated by the first pulse; and detecting response signals.

Preferably, $T_{1\rho}$ is defined (by analogy with NMR) as the decay time of the longitudinal magnetization in the applied $B_1$ field. More preferably, this length is less than 0.3 or 0.1 times $T_{1\rho}$. In this way, efficient use can be made of the available test time, and the spin locking sequence can be operated under the optimal test conditions.

In one variant of the first preferred embodiment (termed "phase split pulses") the second pulse comprises two phase alternated elements, although the phase of the second pulse may alternatively be uniform. The former alternative may be considerably more effective if it is desired to work at off-resonant conditions. For this alternative, preferably, if first and second individual pulse sequences are provided and together form a first pair of such sequences, an additional, second pair of individual pulse sequences is provided for which the order of the phases in the phase reversals is different from the order of the phases in the phase reversals for the first pair. By this feature, any timing or phase errors in the phase reversals can be compensated.

In the phase split pulses variant, preferably the second pulse includes a third element having a phase different from said two phase alternated elements. The third element can enhance sensitivity by providing a further lock on the magnetization. The phase of the third element is preferably intermediate the phases of the first and second elements, and is typically 90° separated from both.

In a further variant of the first preferred embodiment ("stacked pulses") the length of the second pulse (of the pulse sequence) may in certain circumstances be less than, preferably no more than 75% of, more preferably no more than 50% of, the length of the first pulse. This can afford the most important advantage of generating magnetization greater than (typically at least 5, 20 or 50% greater than) that predicted to be available by the appropriate Bessel function. For a spin-1 system the Bessel function predicts that 44% of the total magnetization is available using a single pulse, but using stacked pulses up to 62% or even more may be available.

Preferably, the phase of the second pulse is in quadrature with that of the first pulse. This can optimise the performance of the pulse sequence.

Preferably also, the pulse sequence includes a third pulse at least partially locking the magnetization of the first and second pulses, and preferably being of phase intermediate that of the first and second pulses. This can further assist in locking the magnetization.

Preferably, at least one of the first and second pulses comprises a plurality of elements of different phase (or frequency), so that different spectral profiles can be provided.

Preferably again, the phases of the first and second pulses are arranged so as to provide together excitation peaks at at least two different frequencies. This feature could, for example, be used to excite virtually simultaneously different resonance frequencies in the NQR substance, as also taught in United Kingdom Patent No. 2,286,248 (to British Technology Group Limited).

In a second preferred embodiment, echo signals are generated. Broadly, the signal to noise ratio achievable with the second embodiment will be worse than that achievable with the first embodiment for substances for which $T_{1\rho}$ is longer than $T_2$, but attenuation of spurious signals will be better.

In a first variant of the second embodiment, which has been found to operate successfully, the pulse sequence comprises at least one pulsed spin locking pulse sequence.

In the remaining variants, pulsed spin locking is not used.

In a second variant the pulse sequence is an echo generating sequence comprising pulses having only relative phases 0° and 180°, or 0°, 90°, 180° and 270°. The pulses are otherwise preferably identical in terms of shape, flip angle and the like. These represent perhaps the simplest of the echo generating sequences, and have proven most effective.

In a third variant the pulse sequence comprises at least one individual phase alternated sequence, a first non-phase alternated sequence, and a second non-phase alternated sequence having an alternate phase to the first non-phase alternated sequence. This variant provides directly an improvement to the pulse sequence described in U.S. Pat. No. 5,365,171 described earlier. The variant can ensure that the principle of phase equivalence is correctly adhered to.

Also in the second embodiment, suitably, the pulse sequence may comprise an echo generating sequence using a flip angle which is exclusively less than $45°_{effective}$. It will be understood that a $90°_{effective}$ pulse has a flip angle which generates the strongest free induction decay signal for the nuclear species of interest. In a polycrystalline spin-1 system, a $90°_{effective}$ flip angle corresponds to a flip angle of $119°_{actual}$, the "effective" and "actual" flip angles being related through a well-known Bessel function. The relationship between the effective and actual flip angles is also well-known for other spin systems.

This feature of the present invention arises from the surprising discovery, made pursuant to the present invention, that nuclear quadrupole resonance echo response signals can be generated with excitation at a flip angle of much less than $90°_{effective}$. Hitherto, theoretical considerations had indicated that echo response signals could not be generated with flip angles much less than this value.

The excitation may use a flip angle which is less than $30°_{effective}$, or less than $15°_{effective}$, or less than 10 or $5°_{effective}$.

Preferably, the pulse sequence comprises a plurality of pulses the pulse separation for which is not equal in every case. This can ensure that the echo maxima do not coincide with subsequent pulses, and is particularly useful at low $B_1$ field when the pulses may be relatively longer.

For the same reason, the pulse sequence comprises a plurality of echo generating pulses so arranged that the echo maxima do not in every case coincide with the pulses. This can be achieved, for example, by suitable shaping of the pulse.

Preferably also, the true quadrupole resonance signal is distinguished from the spurious signal in dependence on its (time) gradient, curvature or shape, perhaps in dependence upon whether the true and spurious signals have gradients of opposite sign. This feature arises from the realization made pursuant to the present invention that as the interfering signal decays the true NQR echo signal rises, and that this can be used to distinguish between the two signals. The feature may be put into effect by a filter using a rising exponential function, which has been found experimentally to increase the differentiation of the NQR signal relative to that of the spurious signal by at least 50%.

It is advantageous to incorporate a delay in signal acquisition into the pulse sequence, as suggested above. In the second embodiment this can be achieved in at least two different ways.

In one preferred variant of the second embodiment, the time τ (which is the separation between the initial pulse and the next pulse in the sequence) is set greater than a predetermined duration.

In an alternative preferred variant (suitable particularly for Pulsed Spin Locking), the time τ is set at a relatively short value, but signals from the echoes are only detected after the first few (say, two, five, ten or greater) pulses of the sequence.

The advantage of the latter, alternative variant over the former is that it can yield a better signal to noise ratio.

Also in connection with the second preferred embodiment, it has been discovered that the value of the pulse separation τ is advantageously as small as possible. Hence, it is preferred that the separation between each initial pulse and the next pulse in the sequence is less than once or twice the value of $T_2^*$ of the nucleus whose nuclear resonance is being excited; it may possibly be preferred that this is less than 0.5, 0.3 or even 0.1 times $T_2^*$.

A third preferred embodiment of the present invention essentially combines the features of the first and second preferred embodiments.

The invention is preferably performed in the absence of an applied magnetic field.

In a closely related aspect of the present invention, there is provided apparatus for nuclear quadrupole resonance testing a sample comprising a first type substance containing quadrupolar nuclei and a second type substance which may give rise to spurious signals which interfere with response signals from the quadrupolar nuclei, comprising:

means for applying a pulse sequence to the sample to excite nuclear quadrupole resonance, the pulse sequence comprising at least one pair of pulses;

means for detecting response signals; and means for comparing, for the or each such pair, the respective response signals following the two member pulses of the pair;

the pulse sequence being such that the respective spurious signals following the two member pulses can be at least partially cancelled by the comparing means without the corresponding true quadrupole resonance signals being completely cancelled; and for the or each such pair, the two member pulses being of like phase.

The present invention extends to a pulse sequence for exciting nuclear quadrupole resonance in a sample comprising a first type substance containing quadrupolar nuclei and a second type substance which may give rise to spurious signals which interfere with response signals from the quadrupolar nuclei, comprising at least one pair of pulses, the pulse sequence being such that the respective spurious signals following the two member pulses of the pair can be at least partially cancelled without the corresponding true quadrupole resonance signals being completely cancelled, and, for the or each such pair, the two member pulses being of like phase.

All the features of the method aspect of the invention can be applied to the apparatus and pulse sequence aspects as appropriate.

Preferred features of the present invention are now described, by way of example only, with reference to the accompanying drawings, in which:

FIG. 1 is a block diagram of apparatus for NQR testing according to the present invention;

FIGS. 2(a)(i) and (ii), 2(b)(i) and (ii), 2(c)(i) and (ii), and 2(d)(i) and (ii) are versions of a pulse sequence for use with a first preferred embodiment of the present invention;

APPARATUS

Figure 1:
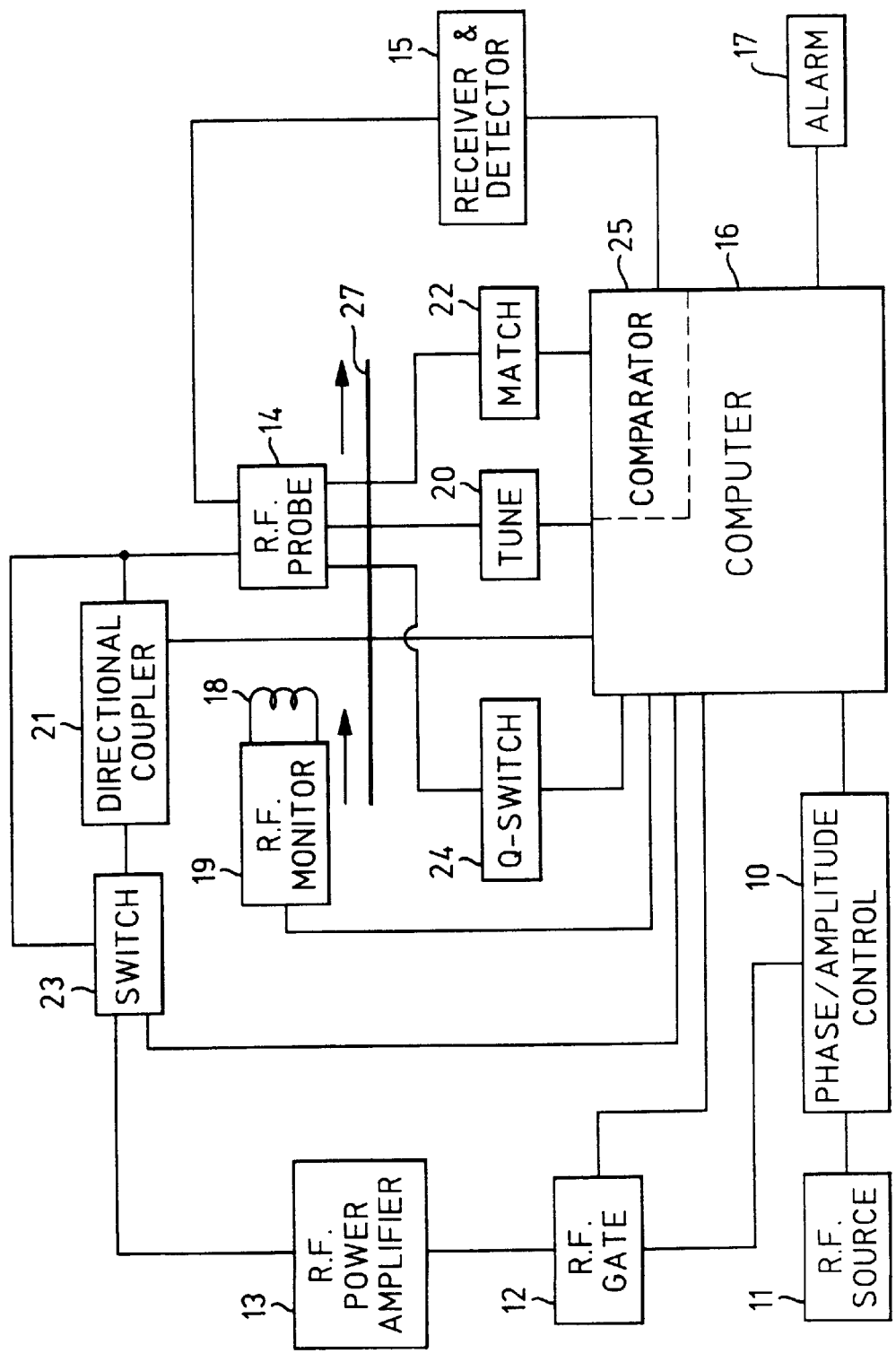

Referring first to FIG. 1, apparatus for NQR testing includes a radio-frequency source 11 connected via a phase/amplitude control 10 and a gate 12 to an r.f. power amplifier 13. The output of the latter is connected to an r.f. probe 14 which contains one or more r.f. coils disposed about or adjacent the sample to be tested (not shown), such that the sample can be irradiated with r.f. pulses at the appropriate frequency or frequencies to excite nuclear quadrupole resonance in the substance under test (for example, an explosive). The r.f. probe 14 is also connected to r.f. receiver and detection circuitry 15 for detecting nuclear quadrupole response signals. The detected signal is sent from circuitry 15 to a control computer 16 (or other control apparatus) for processing, and for signal addition or subtraction. The computer includes some means 17 for producing an alarm signal in dependence upon whether a given threshold of detection for the presence of the particular substance of interest has been exceeded. The alarm signal would normally be used to activate an audio or visual alarm to alert the operator to the presence of the substance under test.

The control computer 16 also controls all pulses, their radio frequency, time, length, amplitude and phase. In the context of the present invention all of these parameters may need to be adjusted precisely; for example, phase may need to be varied in order to be able to generate echo responses.

Re-tuning of the r.f. probe 14, alteration of its matching and alteration of its Q factor may all need to be carried out dependent upon the nature of the sample. These functions are carried out by the control computer 16 as follows. Firstly, the computer checks the tuning of the r.f. probe 14 by means of a pick-up coil 18 and r.f. monitor 19, making adjustments by means of the tuning control 20. Secondly, the matching to the r.f. power amplifier 13 is monitored by means of a directional coupler 21 (or directional wattmeter), which the computer responds to via a matching circuit 22, which in turn adjusts the r.f. probe 14 by means of a variable capacitance or inductance. The directional coupler 21 is switched out by the computer 16 when not required, via switch 23. Thirdly, the Q factor of the r.f. coil is monitored by a frequency-switch programme and adjusted by means of a Q-switch 24 which either changes the coil Q or alternatively alerts the computer to increase the number of measurements.

The control computer 16 may be programmed in various ways to reduce or eliminate the spurious interference described above by controlling the pulse amplitudes and phases by means of the control 10. These ways are described later. These ways involve the use of a comparator 25 for comparing the response signals from different pulses by making appropriate changes to the phase of the receiver and detection circuitry 15, and passing the resultant signals to the remainder of the control computer 16 for further processing.

Shown diagrammatically in FIG. 1 and designated as 27 is some means, such as a conveyor belt, for transporting a succession of samples to a region adjacent the r.f. probe 14. The computer 16 is arranged to time the application of the excitation pulses substantially simultaneously with the arrival of a particular sample adjacent the probe. In alternative embodiments, instead of the sample being carried on a conveyor belt, it may actually be a person, and the r.f. probe maybe in the form of a walk-through gateway or a hand-held wand.

Although the apparatus described above would usually employ rectangular pulses, other pulse shapes may be employed. Furthermore although usually the radio-frequency probe would utilise a single coil for both transmission and reception of signals, any appropriate number of coils may be used, and different coils can be used for transmission and reception. Also, the apparatus would usually operate in the absence of any applied magnetic field.

Principle of Phase Equivalence, and Spurious Signal Cancellation

In a sequence of r.f. pulses, of any amplitude, length and shape, which has been designed to distinguish between genuine NQR signals and spurious interference from the sample by means of phase cycling, it is important to compare and manipulate responses generated by r.f. pulses which as far as possible have the same relative phase. In other words, "like" is compared with "like"; this principle is termed herein the principle of "phase equivalence".

It is also advisable that these pulses be identical in other respects such as amplitude, frequency, shape and length, or at least that the consequences of any such differences can be allowed for, but the principle of equivalent phases is the most important. Satisfying this principle can ensure that any spurious response, the phase of which differs from that of the exciting pulse by an unknown amount, can be annulled by means of a suitable phase cycle.

The pulse sequences described pursuant to the present invention can satisfy the principle of phase equivalence.

The discovery of the principle of phase equivalence pursuant to the present invention is predicated on the following theoretical and experimental findings.

The response of many materials to an r.f. pulse may depend on the precise phase of that pulse, not merely its amplitude. The response may also depend on the length of the pulse. Conversely an NQR signal generated by an exciting pulse has its phase determined by the phase of the pulse, but the actual shape of the response appears to be relatively independent of the phase of the exciting pulse.

This point is illustrated with reference to four experiments in which the signal response to a single r.f. pulse is considered for the explosive RDX and sand (which gives a spurious piezoelectric response). In the experiments a single r.f. pulse is repeated at a pulse repetition time greater than 5 $T_1$. The experiments are as follows:

(i) All phases identical and signals added (0°, 0°, 0°, 0°)
 (ii) All phases identical and signals subtracted (0°, 0°, 0°, 0° . . . )
 (iii) Alternative phases and signals added (0°, 180°, 0°, 180° . . .)
 (iv) Alternative phases and signals subtracted (0°, 180°, 0°, 180° . . .)

Intuitively, signals would be expected from (i) and (iv), but no signals would be expected from (ii) and (iii), and this is essentially the case for RDX (allowing for any phase mismatch). For RDX, (ii) shows no signal (iii) a very small signal, while (i) and (iv) show large signals.

However, for sand, a material producing a spurious response, only (ii) shows no signal (−33 dB attenuation from (iv)), while (iii) shows only a partially reduced signal (about −12 dB attenuation). Both (i) and (iv) give large signals.

Hence it is clear that comparison of 0° with 180° phases is not sufficient for full cancellation of spurious signals. Like phase must be subtracted from like phase (the principle of phase equivalence). It is not sufficient to eliminate a spurious signal by adding signals following 0° and 180° pulses.

It is believed that the principle of phase equivalence is important since interfering substances such as sand can generate responses whose phase is not precisely defined by that of the excitation pulse. There is a phase shift between the excitation pulse and the spurious response, which may therefore vary according to the excitation phase and as the spurious signal decays.

In order to obtain cancellation of the spurious interfering signals, it is necessary to prepare the spin system in different ways prior to the r.f. pulse so that it will respond in two or more different ways to identical r.f. pulses. This preparation must be done sufficiently far before the signal acquisition stage to allow any effects due to the preparation on other elements of the system to have become negligible.

In the present invention, this can be achieved by arranging the phases of respective pulses preceding (preferably immediately preceding) the two phase equivalent pulses being compared to be different. Preferably the phases differ by 180°, but lesser phase differences could also produce satisfactory results.

In order that the comparison yields meaningful results, it is preferred that the first and second individual pulse sequences (if provided) generate respective nuclear response signals of the same magnitude but of differing phase. This is achieved in the preferred embodiments by having the same number of pulses in both sequences, by comparable pulses in each sequence having the same phase, and by comparable pulses in each sequence generating the same flip angle. If, aside from the initial pulse, more than one further pulse is provided per individual sequence, such pulses may each be separated by the same pulse separation; that separation may be larger than the separation between each initial pulse and the next pulse in the sequence.

Three different preferred embodiments of the present invention, all adhering to the above principles, are now described for use with the testing apparatus described above.

First Embodiment—Spin Locking Sequences

In a first preferred embodiment of the invention, in brief interfering signals are removed from the free induction decay following two radio-frequency pulses comprising a "spin locking" (SL) type sequence.

The basic technique is to use an initial preparation pulse of flip angle 90° and phase 0° (termed a "$90°_{0°}$" pulse) to rotate the magnetization into parallelism with (say) the Oy axis of the rotating frame ($B_o$ lies along Oz and $B_1$ along Ox). This pulse is then immediately followed by the so-called spin locking pulse of variable length and a phase shifted by 90° with respect to the first. Hence the combination of the two pulses can be written in the form $(90°)_{0°}-t_{90°}$, where "t" represents the adjustable length of the second pulse. The combination of the two pulses is sometimes known as a sandwich or composite pulse. However, herein, throughout, the combination is regarded as two distinct pulses.

In the spin locking phase of the cycle, the magnetization is parallel to the r.f. field, and is observed to decay with a time constant $T_{1\rho}$, the spin-lattice relaxation time in the rotating frame. In contrast, after a single 90° pulse, the magnetization would decay with a time constant $T_2$ or $T_2^*$. In many substances $T_{1\rho}$ is much closer to $T_1$ than $T_2$ or $T_2^*$; since in solids $T_1 \gg T_2$, spin locking can conserve the magnetization for a much longer period of time.

In the first embodiment of the invention, effectively the increased relaxation time is employed to distance the signal detection in time away from any interfering signal generated by the first, initial pulse of the sequence, and then any interfering signal following the second, spin locking pulse is removed by a comparison technique employing phase shifting, as described in more detail later.

One particularly important feature of the invention is the discovery that spin locking techniques function in NQR. This was unexpected, because of the multiplicity of different orientations of the crystallites in a powdered sample with respect to $B_1$, giving rise to a range of spin locking r.f. fields. Furthermore, in NQR $B_1$ must be larger than all other "internal" fields, such as dipolar interactions and inhomogeneity broadening. Also, there is no direct equivalent of the NMR rotating frame in NQR, in which the effect of the static magnetic field is viewed as an effective rotation close to the Lamor frequency.

The comparison technique referred to above, employing phase shifting or cycling, is now described in more detail with reference to a number of variants of the first embodiment.

First variant of the first embodiment—basic pulse sequence

In a basic variant of phase shifting, illustrated with reference to FIGS. 2(a)(i) and (ii), any interfering signals generated by the second pulse are removed by the use of two pulse sequences (designated "A" and "B") which are as nearly as possible identical except that the phase of the initial pulse in the latter sequence (B) is shifted by 180° with respect to the phase of the initial pulse in the former sequence (A). As suggested above, in the latter B sequence this has the effect of shifting the phase of the NQR response signal following the second, spin locking pulse by 180°, but has no effect on the phase of the interfering signal, whose phase depends only on the phase of the immediately preceding pulse.

Hence, in this basic variant of phase shifting, as illustrated in FIGS. 2(a)(i) and (ii), in the first (A) pulse sequence the pulse sequence $\alpha_{0°}\text{-}t_{90°}$ is generated, with the signal being acquired following the second, spin locking pulse. The signal $S_A$ includes both the free induction decay NQR response signal ("Q") and the interfering signal ("I"):

$$S_A = Q + I$$

In the second (B) pulse sequence, the two pulses are identical to the corresponding pulses in the first sequence, save that the phase of the initial, preparatory pulse has been shifted by 180°. Hence the sequence is $\alpha_{180°}\text{-}t_{90°}$, which generates the signal $$S_B = -Q + I$$

Subtraction of $S_A$ and $S_B$ then removes I and sums Q.

Usually a large number of A and B sequences would be applied to the sample, to improve the signal to noise ratio, with the results from the two sequences either being separately accumulated or being processed immediately. The sequences may for instance be performed in the order ABABABAB..., or in the order AAA...BBB... Usually the same number of A and B sequences would be performed, with the intent that the comparison between the A and B sequences is as close as possible.

Second variant of the first embodiment—full Phase cycling

In a more complex but more effective version of the first preferred embodiment, a complete phase cycle is utilised in which all possible combinations of the phases of the two pulses in the pulse sequence are used, subject to the condition that the first pulse differs in phase from the second by 90°. Hence one possible set of phase cycled sequences, using four pairs of individual sequences, is as follows:

| Sequence type | Phase of first pulse (P1) | Phase of second pulse (P2) | Receiver Phase | Real Channel | Imaginary Channel |
|---|---|---|---|---|---|
| A | 0° | 90° | 90° | +Y | −X |
| B | 180° | 90° | 270° | −Y | +X |
| A | 90° | 180° | 0° | +X | +Y |
| B | 270° | 180° | 180° | −X | −Y |
| A | 180° | 270° | 270° | −Y | +X |
| B | 0° | 270° | 90° | +Y | −X |
| A | 90° | 0° | 0° | +X | +Y |
| B | 270° | 0° | 180° | −X | −Y |

It is to be noted that the shift in the receiver phase between the A and the B sequences is 180°, so that subtraction of the B sequence signals from the A sequence signals can be effected. It is also to be noted that the receiver phase is not necessarily in phase or anti-phase with the phase of the second pulse. Any phase values will suffice provided that they have the effect of subtracting the B sequence signals from the A sequence signals, or vice versa. This point is illustrated in the last two columns of the above table, which show the signal components X+iY in the two receiver channels as the receiver phase is switched. The sum of the components over the eight permutations of phase is zero, as indeed is their sum over each pair of individual pulse sequences. This demonstrates that the interfering signals generated by the second pulse cancel, whereas the NQR response signals are preserved because of the 180° shift in the phase of the initial pulse between each A and B sequence.

Whereas the above four pair sequence cycles the phase of the P2 pulse by 90° for each pair of individual pulse sequences, a simpler two pair phase cycle version is also possible, which cycles the phase by 180°. This is as shown below:

| Sequence type | P1 | P2 | Receiver Phase | Real Channel | Imaginary Channel |
|---|---|---|---|---|---|
| A | 0° | 90° | 0° | +X | +Y |
| B | 180° | 90° | 180° | −X | −Y |
| A | 180° | 270° | 180° | −X | −Y |
| B | 0° | 270° | 0° | +X | +Y |

The presently described full phase cycling variant of the first embodiment (either in its four or eight cycle form), can assist not only in the removal of interfering signals, but also in the removal of baseline drift and error, as well as in solving problems caused by minor imperfections such as phase errors in the individual excitation pulses. This variant may be used with the remaining variants described herein.

The remaining variants (the third and fourth variants) of the first embodiment each use a combination of two or more pulses and/or different widths. In the third variant (phase split pulses) such a combination is used in the spin locking pulse; in the fourth variant (stacked pulses) such a variant is used in the initial preparatory pulse.

Third variant of the first embodiment—Phase split pulses

Variations in temperature or other such environmental parameters may affect the resonance frequency of the nuclei under investigation. Whilst the pulse sequence shown in FIGS. 2(a)(i) and (ii) can operate successfully at off-resonant conditions, over a limited bandwidth, an alternative version of the pulse sequence is capable of considerably better off-resonant performance. This sequence, involving the use of what are herein termed "phase split pulses", is now described with reference to FIGS. 2(b)(i) and (ii). The sequence is capable of increasing the NQR signal.

The background to the alternative pulse sequence is as follows. During the spin locking phase of sequence A shown in FIGS. 2(a)(i) and (ii), at off-resonant conditions the magnetization generated by the first pulse processes (or nutates) about the resultant of $\omega_I$ and $\Delta\omega_Q$ (where $\Delta\omega_Q$ is the off-resonant frequency shift), so that the magnetization vector dephases. It has been found pursuant to the present invention that, to take into account the difficult conditions in the rotating frame and to improve the sensitivity of the tests off-resonance, it may be advantageous to regenerate the initial state. This, it has been found, can be achieved by reversing the direction of $B_1$ (or $(\omega_I/\gamma)$) by means of a 180° phase shift in the spin locking pulse; if this phase reversal is performed exactly half-way through the spin locking pulse, the reversal of the spin nutation about the resultant of $\omega_1$ and $\Delta\omega_Q$ regenerates the original signal (that is, refocusses the magnetization) at the end of the spin locking sequence (apart from any change due to relaxation which, it is believed, would be relatively minor).

FIGS. 2(b)(i) and (ii) illustrate this phase reversal technique. The spin locking pulses shown in FIGS. 2(a)(i) and (ii) (of length t and phase 90°) are replaced in FIGS. 2(b)(i) and (ii) by spin locking pulses split into equal portions of length t/2 and of phase respectively 90° and 270°. In similar fashion to that described previously, subtraction of the free induction decays following cycles A and B respectively removes the spurious ring-down following the end of the spin locking pulse. Again as described previously, the free induction decay following the initial preparation pulse is effectively removed by allowing the spin locking pulse to run for sufficient time for the spurious interfering signals to decay to zero. A pulse length for the spin locking pulse of between 1 and 3 or 4 ms has been found to be effective for the 3.41 MHz transition in RDX.

In order to eliminate spurious signals more effectively, a complete phase cycle can be performed in a fashion analogous to that already described above. This may be, for example, either the two or the four pair cycle mentioned previously.

It can be important that the two spin locking pulse halves are of equal duration and are separated by a phase difference of precisely 180°. Otherwise a splitting of the resonance line may occur. To remove potential errors in the timing and 180° phase shift of the spin locking pulse, it may be advantageous to implement the phase cycle so that there are equal numbers of sequences in which the orders of the phases in the phase reversal are respectively 0°–180° and 180°–0°. Within individual pairs of A and B sequences, in order that like is compared fully with like, the order would remain the same. However, for different pairs the order could be changed. Thus, for example, a complete phase cycle (with either two or four pairs of individual sequences) could be performed with the order being 0°–180°, and then a further similar complete phase cycle could be performed with the order being 180°–0°.

Sequences with merely 0°–180° phase changes have been found to be good at enhancing signals for longer pulses, but as the off-resonance effects are not apparently refocussed they cannot substantially increase bandwidth.

To counter this and other problems, various subvariants of the phase split pulse variant of the invention have been devised. In a first sub-variant, further improvements in sensitivity may be obtained by the insertion of additional odd numbers of actual phase reversals during the spin locking sequence, so that, for example, the spin locking pulse would have phases of the form (0°–180°–0°–180°) (3 actual reversals) or (0°–180°–0°–180°–0°–180°) (5 actual reversals).

In a second sub-variant, a spin locking pulse of the form (P2A, P2B, P2A, P2C) is employed, where P2B and P2C are typically 180° apart in phase and P2A is typically 90° from both of them, with all elements of the locking sequence being typically of equal lengths. Hence a spin locking pulse of the second sub-variant might have phases of the form (0°–90°–0°–270°), with the preparation pulse having a phase of 90°. The pulse may also have a further repeated element, so that the phases are of the form (0°–90°–0°–270°–0°–270°–0°–90°), as shown in FIG. 2(c) (i). FIGS. 2(c)(i) and (ii) also show that this spin locking pulse would be used in a pair of individual pulse sequences, the members of the pair having preparatory pulses of phase 90 and 270°.

The basic premise of the second sub-variant is to allow for the dephasing which occurs when the r.f. pulse is off-resonance. In the rotating frame, the magnetization vector then moves away from the spin locking pulse, so that both parallel and perpendicular components develop; phase switching by 90° represents an attempt to lock both these components for at least part of the spin locking period. A phase shift of 180° is then added to refocus in part those components which have moved seriously away from parallelism with $B_1$ during the first three segments.

The resultant response signal obtained by using the A and B sequences of FIGS. 2(c)(i) and (ii) is asymmetric in the frequency domain, since phase changes are equivalent to changes in frequency. Therefore in an enhancement of the second sub-variant, the A and B sequences are combined with "mirror image" C and D sequences, as shown in FIGS. 2(d)(i) and (ii). The summed responses of the sequences A to D, implemented sequentially, can provide a performance which is symmetrical about the excitation carrier frequency and which has relatively broad bandwidth.

Similar improvements in excitation bandwidth could be obtained by applying discrete changes in frequency between individual pulses. Furthermore, a combination of both phase shifts and frequency changes could produce an even better performance in that the changes in carrier frequency can be made to compensate for the changes in phase, an effect of some importance when long r.f. pulses of narrow bandwidth are necessary; this is explained in detail below in relation to the fourth variant. Also, further improvements could be obtained by using a full phase cycle, as described in relation to the second variant of the first embodiment.

Fourth variant of the first embodiment—stacked pulses

Another variant of the first embodiment is to combine two, three or more pulses of different phases and/or different widths, usually in the initial preparatory pulse. Such a combination of pulses is referred to as "stacked" pulses. Stacked pulses are also used in the second embodiment of the invention (described later); in this latter case they are used as stand-alone pulses, and are spin locking pulse sequences in their own right, although the lock may not be maintained particularly long.

In general terms, stacked pulses are particularly applicable when there is a restriction on the flip angle which can be generated by individual pulses, for example, when only low values of the $B_1$ field must be used. Hence, as an example, only 30° instead of the optimum value for spin-1 nuclei of 119° may be available.

A typical stacked pulse consists of several (say n) usually contiguous pairs of low flip angle pulses P1A and P1B, with a number of phase shifts, say of 90°, as for example $(P1A_{0°}\text{–}P1B_{90°})_n$, to effect the locking (n being greater than or equal to 1 and typically being 2, 3, 4, or even more). Such a pulse can function almost as well as a single optimal flip angle pulse; it is believed that the reason for this is that the second P1B pulse of phase 90° firstly locks in the X, Y plane part of the magnetization transferred by the first pulse and secondly maximizes the magnetization in the X, Y plane. Also, the second pulse serves to define the phase for future pulses.

If the P1A–P1B pulse is repeated (that is, n is greater than 1), then, because of the low flip angle which the P1B pulse generates more magnetization is transferred by the third pulse, of relative phase zero, which is then locked by the fourth pulse in the stack, of relative phase 90° and so on.

Although the second (P1B) pulse may be longer than (for instance twice as long as) the first (P1A) pulse, or these pulses may be the same length, even better signal to noise ratio can be achieved by choosing the second (P1B) pulse to have a smaller length than the first. The reason for this is that the basic two-pulse sequence $P1A_{0°}\text{-}P1B_{90°}$ (with the length of the first pulse being $t_A$ and the length of the second $t_B$) generates both real (X) and imaginary (Y) components of the magnetization; if $t_B = t_A/2$, the real and imaginary components have their maximum at the same point in time, so that the signal magnitude is root two times larger than if $t_B=t_A$, and the relative phase of the combined signal is approximately 26.5° for a first pulse of optimal flip angle, in which case the magnetization generated is close to 62%.

The resultant phase of the stacked pulse will depend upon the number of the component pulses, their respective phases and their relative lengths.

Further, even shorter pulses, possibly with intermediate phases, not necessarily 0, 90°, 180° or 270° can be employed to produce even more magnetization in the X,Y plane, such magnetization being obtained from any further magnetization along the Z-direction which remains after the first two pulses. For example, it is possible to use a third (P1C) pulse applied at a different phase following the first two, that phase being selected to produce a magnetization larger than the Bessel function value of 0.436 appropriate to single 119° pulses applied to a polycrystalline sample. Since the purpose of the third (usually shorter) pulse is to bring more of the remaining magnetization into the X, Y plane (to maximize the magnetization), as well as to lock the magnetization already in the X, Y plane, its phase will suitably be between 0 and 90° (preferably between 10 and 60° or 20 and 45°, more preferably close to 26.5°) depending on the relative lengths of the pulses. Again, a fourth (P1D) pulse could be applied to bring yet more of the remaining magnetization into the X, Y plane; its phase will suitably be greater than 90°. Yet further pulses will have phase 90° or less (say greater than 45°) greater than the phase of the preceding pulse.

An advantage of stacked pulses as described is that they can not only provide effective spin locking but also they can actually enhance the signal to noise ratio.

If the individual pulse lengths are seriously limited, it may be an advantage to use longer stacked sequences. For example, in a particular experimental set-up, with the sequence (P1AP1B), a pulse length of 10 μs, n=2 gives the optimum response, whereas with a pulse length of 5 μs, n=5 is required.

In the present context of spin locking pulses, a sequence of stacked pulses replaces the initial preparatory pulse, there being available all the previously discussed possibilities for use in the spin locking pulse. Phase cycling is then achieved by cycling the phases of the stacked pulses in the same way as for the basic spin locking pulse sequence (see the first and second variants of the first embodiment).

The following table shows two such suitable fully phase cycled sequences, the sequential combination of which yields a response which is reasonably symmetrical about the centre frequency. In the table, each pair of A and B pulses is repeated n number of times.

| Sequence type | Phase of first part of stacked pulse (P1A) | Phase of second part of stacked pulse (P1B) | Phase of second pulse (P2) | Receiver Phase |
|---|---|---|---|---|
| A | 90° | 0° | 0° | 0° |
| B | 180° | 270° | 270° | 270° |
| A | 270° | 180° | 180° | 180° |
| B | 0° | 90° | 90° | 90° |
| A | 270° | 0° | 0° | 180° |
| B | 0° | 270° | 270° | 90° |
| A | 90° | 180° | 180° | 0° |
| B | 180° | 90° | 90° | 270° |
| A | 90° | 0° | 180° | 0° |
| B | 180° | 270° | 90° | 270° |
| A | 270° | 180° | 0° | 180° |

-continued

| Sequence type | Phase of first part of stacked pulse (P1A) | Phase of second part of stacked pulse (P1B) | Phase of second pulse (P2) | Receiver Phase |
|---|---|---|---|---|
| B | 0° | 90° | 270° | 90° |
| A | 270° | 0° | 180° | 180° |
| B | 0° | 270° | 90° | 90° |
| A | 90° | 180° | 0° | 0° |
| B | 180° | 90° | 270° | 270° |

In such sequences typically $t_B=t_A/2$ or $t_B=t_A$ but other ratios may be used in order to optimize the signal response and the excitation bandwidth. Such sequences have the further advantage that by the appropriate choice of such ratios, the shape and position of the maximum of the excitation profile may be altered. This allows, for example, for a maximum in the excitation profile to be moved off-frequency from that of the carrier in order to improve the filtering (noting that an analogous effect was described above in relation to phase split pulses). Multiple excitation maxima may also be generated in dependence upon the rate at which phase is switched. For example, in a four pulse sequence (n=2), the phase of which is switched every 250 μs, signal maxima appear at intervals of 1 kHz off-resonance, corresponding to a shift in frequency of $\Delta\omega=\phi/t$, or, for $\phi=90°$, $\Delta\nu=¼t$. This effect has two important advantages; it may be used -firstly to enhance the excitation range of the preparation pulse and secondly to increase the effective bandwidth of the spin locking pulse. It may be desirable to combine changes of phase and changes of frequency to produce the required spectrum.

It will be appreciated that the above principles can be applied not just to the preparatory pulse of the spin locking sequence (as in the present variant) but also to the spin locking pulse (see the previous, third variant, for example).

General considerations for the first preferred embodiment

The important conditions to be advantageously maintained in the phase cycling technique of the first embodiment are firstly that, as regards all P2-type pulses, like is subtracted from like. That is, for example in the second of the four tables above (given in the section which describes the second variant of the first embodiment), the two 90° P2 free induction decay signals exactly cancel, as do the two 270° signals. Pulse and phase imperfections therefore cancel.

Secondly, the receiver phases are adjusted to allow appropriate subtraction of the interfering signals and free induction decay response signals.

Thirdly, the respective P2 type pulses in each A and B pair of individual sequences have phases which are preferably equally distributed through the 360° phase variation range.

Fourthly and finally, for each pair the P1 type pulses have phases which preferably are in quadrature with the phases of the P2 type pulses.

Various other conditions are also preferably fulfilled if any of the variants of the first embodiment of the present invention are to function satisfactorily. These are as follows.

Firstly, one particular condition is that the pulse length of the second, spin locking pulse, t, is sufficiently long to translate the NQR signal completely away from any interfering signal generated by the first, initial pulse, since this interfering signal is not removed by the phase shifting. Expressed somewhat differently, the pulse length of the next pulse following each initial pulse is preferably sufficiently long that any interfering signal generated in response to the initial pulse does not persist to any substantial extent beyond the end of that further pulse. This condition is now discussed in more detail.

It has been discovered that the interfering signals referred to above tend to decay fairly rapidly after an r.f. pulse, usually within, say, 350, 500, 750, 1000 or 1500 μs of the end of the pulse. Thus, provided the pulse length of the second pulse is chosen to be significantly more than the decay time of these signals, useful response data can be derived subsequent to the second pulse notwithstanding any interfering signal following the first. A pulse length equal to or greater than 200, 400, 500, 600, 700, 1000 or 1500 μs has been found empirically to be satisfactory in most circumstances. To make efficient use of the available test time, the length is preferably less than 3, 2, 15, 1 or even 0.7 ms. A sufficient decay for the response signal from which it is desired to filter out the interfering signal might be to below 20, 10 or 5% of its initial peak value, below which the interfering signal would be considered to have decayed to insignificance. Alternatively, the interfering signal may be considered to have decayed to insignificance when its intensity is below 20, 10 or 5% of the maximum intensity of the NQR signal. Of course, it is not desirable to use too large a delay.

Secondly, a further, similar (but potentially less important) condition is that the pulse length of the second pulse, t, is at least as long as, preferably longer than (say, 3 or 5 times longer than) the free induction decay time, $T_2^*$. This can ensure that the response signal following the first, initial pulse can decay fully before the start of that following the second pulse.

Thirdly and finally, a particularly important feature is that the pulse length of the second pulse, t, is advantageously less than, say, five times or three times the spin-lattice relaxation time in the rotating frame, $T_{1\rho}$. In this way, efficient use can be made of the available test time, bearing in mind that there are usually severe practical restraints on this time; where the invention is being applied to the detection of the presence of a particular substance, the total allowable test time may only be a few seconds. Hence, in fact, t is more preferably less than $T_{1\rho}$ or even less than 0.5, 0.3 or 0.1 times $T_{1\rho}$.

Also to make better use of the available test time, pulses of different phases could be interleaved.

Examples using the first preferred embodiment

Referring to FIGS. 3 to 8, results of various experiments conducted using the first and second variants of the first embodiment of the invention are now presented.

In these experiments the value of the $B_1$ field for the initial pulse was kept constant at 16 Gauss. For the particular experimental conditions employed a pulse length of 20 μs could generate a $119°_{actual}$ initial pulse. Pulse length was varied to supply alternative flip angles. In this sense the experiments can be thought of as "constant $B_1$" experiments. All the experiments were conducted using the 3.41 MHz line of a sample of the explosive RDX. A pulse length of 20 μs was employed for the initial pulse except where otherwise stated.

Figure 3:
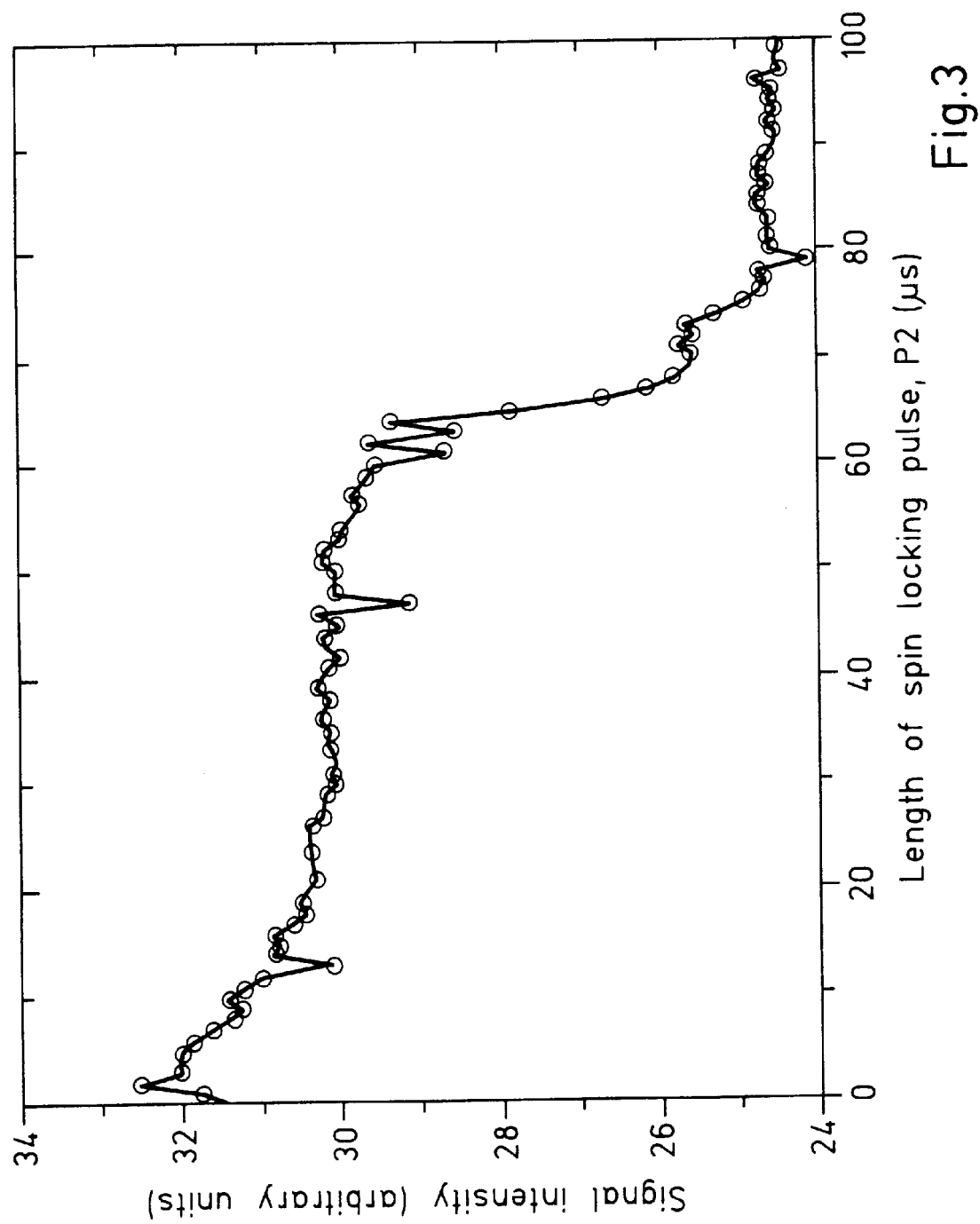
FIG. 3 is a plot of signal intensity versus the length of a spin locking pulse, P2, derived using a first variant of the first embodiment of the invention.

For the example illustrated in FIG. 3, an on-resonant spin locking sequence (that is, a sequence within 0.5 or 1 kHz of the relevant NQR resonance) was applied to the sample, with the length of the initial pulse, P1=20 μs, and the spin locking pulse, P2, being of variable length. The four pair phase cycling sequence shown in the relevant table above was employed. The respective signal intensities following the second pulse, P2, were determined for 100 different values of the length of the second pulse. These 100 signal intensities have been plotted in FIG. 3.

As can be seen from FIG. 3, the signal intensity is almost constant out to 60 μs, then drops quite rapidly by about 20%, possibly when the length of P2 corresponds closely to a flip angle of $254°_{actual}$ (the value of the flip angle of a single pulse to produce the zero signal intensity for that pulse). It is to be noted that, although the units of the signal intensity are arbitrary, the plot does not extend down to the origin (which is zero).

Figure 4:
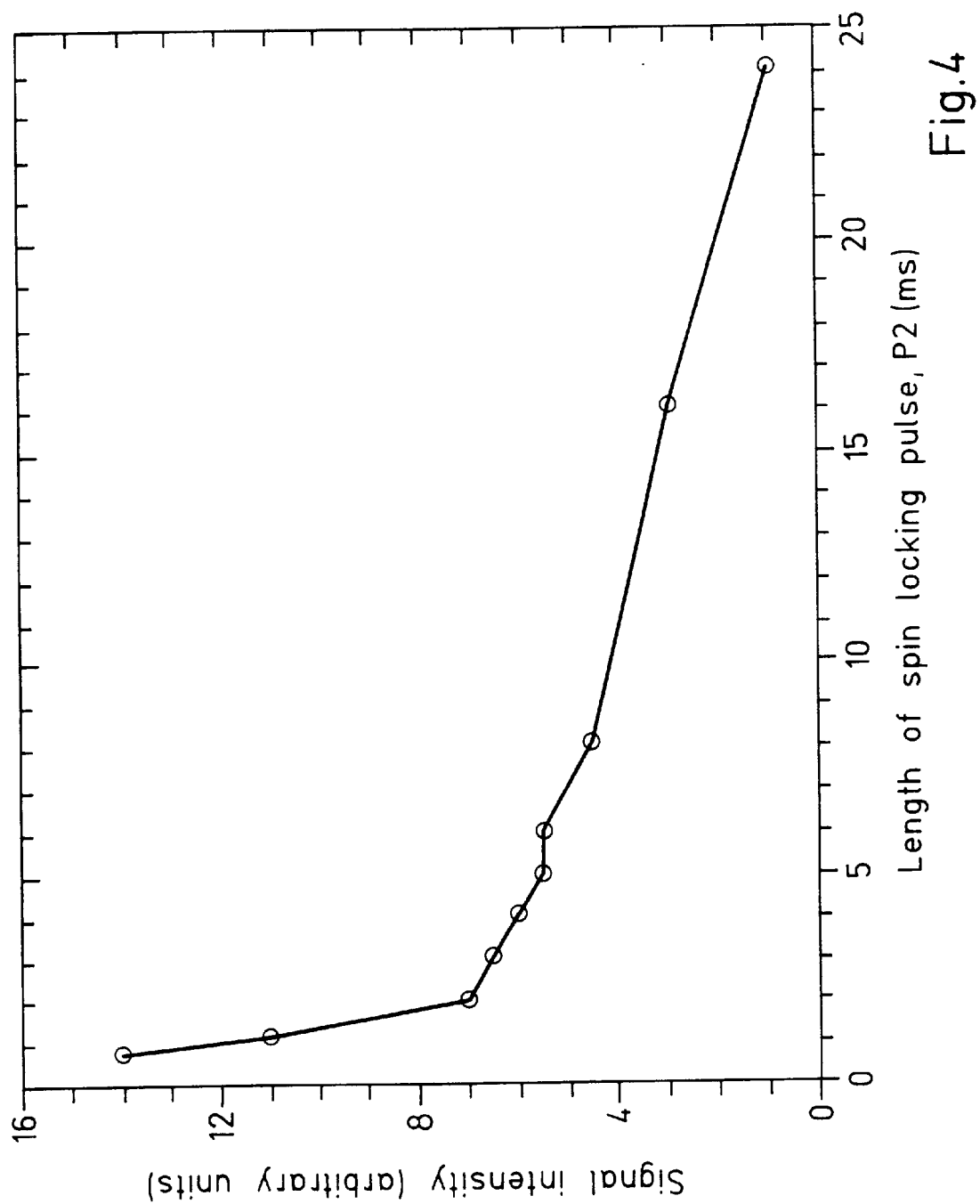
FIG. 4 is a plot similar to that of FIG. 3, but showing a different portion of the signal versus pulse length curve.

FIG. 4 shows a similar plot to that of FIG. 3, but this time in the presence of nickel-plated screws, which are known to cause substantial interfering signals. The plot of FIG. 4 has also been extended out to very much longer spin locking times. The full phase cycling sequence referred to above was again employed. It will be apparent that an NQR signal can be seen out to 2 ms, with some loss, and even out to 12 ms, but with significantly more loss. The presence of the screws considerably reduced the Q factor of the r.f. probe, and hence the signal to noise ratio of the response signals. Nevertheless, it has been ascertained that the interfering signals were substantially completely removed from the response signal. The interfering signals would have given rise to signals in the region of five to ten times as intense as the true NQR responses shown in FIG. 4.

In a further experiment similar to that described in relation to FIG. 4 (but not illustrated herein), no phase cycling was employed; in other words, only A-type pulse sequences were employed. In this experiment the NQR response was completely obscured by the interfering signals generated from the screws.

Figure 5:
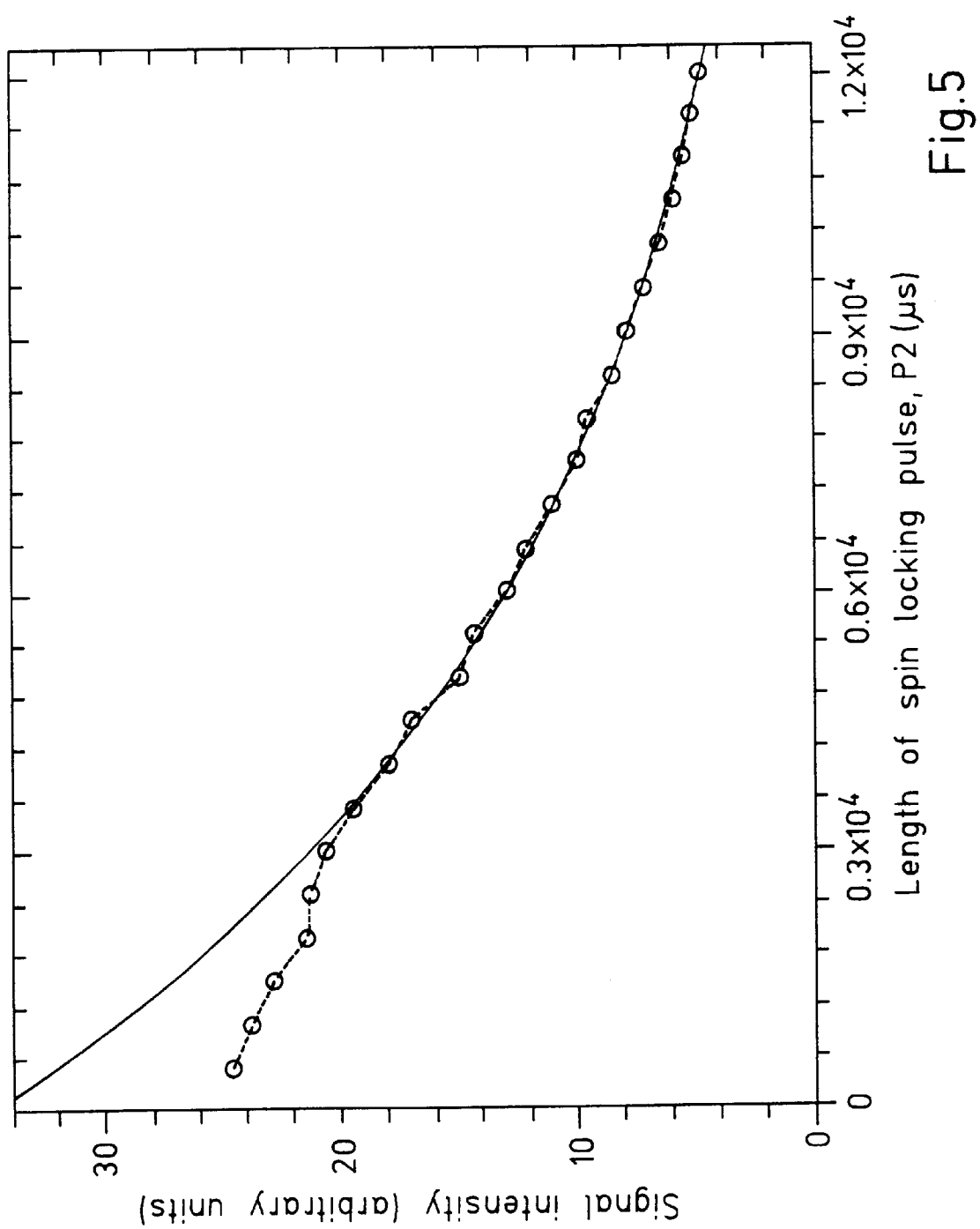
FIG. 5 is a plot similar to that of FIG. 3, but again showing a different portion of the signal versus pulse length curve.
Figure 6:
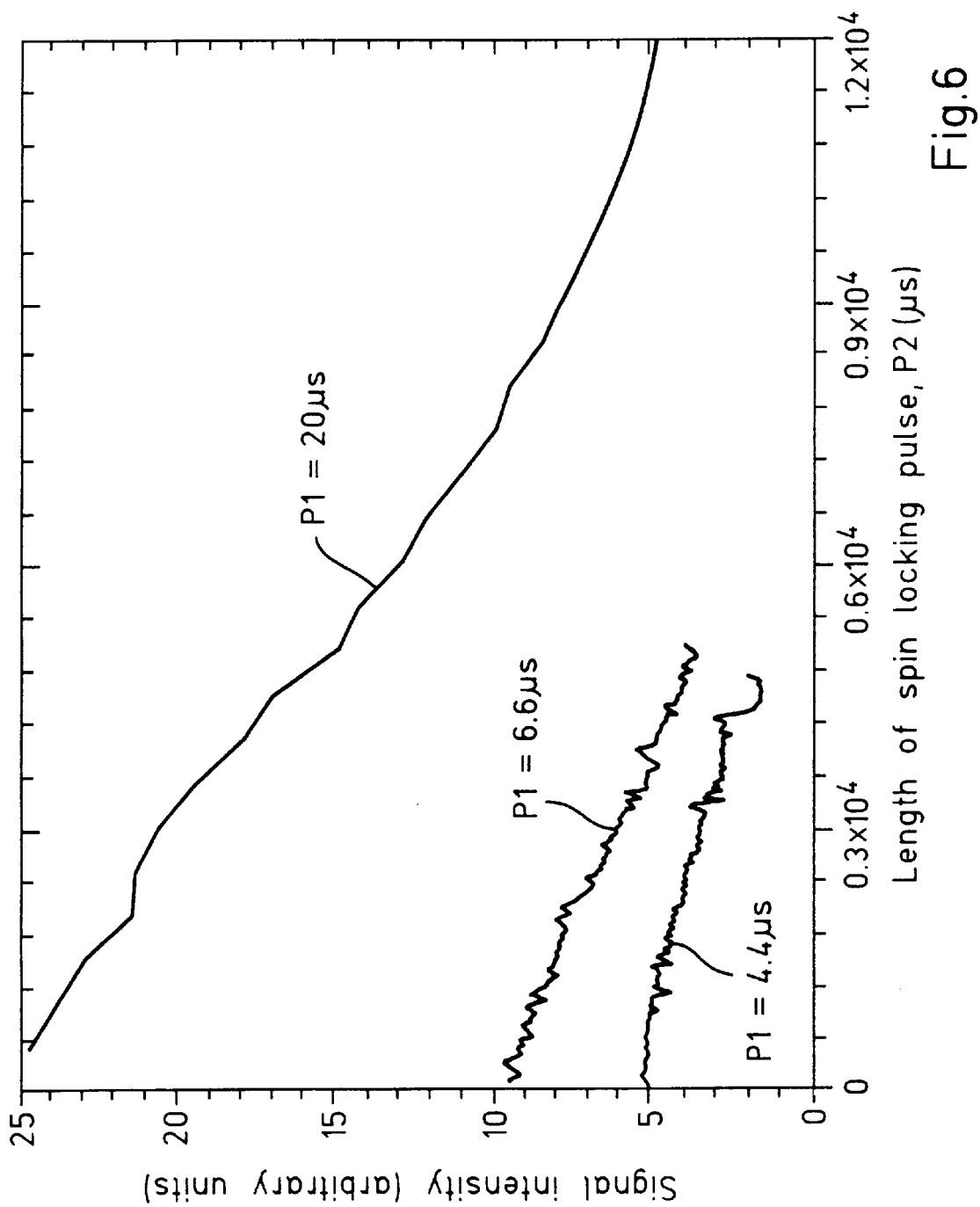
FIG. 6 is a plot similar to that of FIG. 5, but showing three different plots corresponding to three different pulse lengths for an initial preparatory pulse, P1.

The plot of FIG. 5, which is similar to that of FIG. 3, but shows a different range of the length of the spin locking pulse, P2, has been used to provide an estimate of the NQR spin locking time, $T_{1\rho}$, at room temperature for the 3.42 MHz line of RDX with $B_1$=1.6 mT (noting that $T_{1\rho}$ may vary with $B_1$). The experimental data points are illustrated by the open circles, whilst the line shown is the best fit of an equation of the form $$y=a.exp(-x/b)$$

for lengths of the second P2 pulse longer than t=3 ms. A least squares fit yields a value for "a" of 35 and a value for "b" of 5990, indicating a value of $T_{1\rho}$=6 ms. This compares with a value of $T_1 \approx 14$ ms and $T_2 \approx 8$ ms, whereas $T_2^*$=0.7 ms, all values being taken at room temperature.

The plot of FIG. 5 demonstrates that the spin locking technique can conserve magnetization for times considerably longer than those required for any interfering signal generated by the first, initial pulse to become much less than the NQR signal.

A further similar plot (see FIG. 6) illustrates the effect of reducing the length of the initial P1 pulse from 20 μs, so that the flip angle reduces from 119°. The closed square symbols refer to a flip angle of 119°, the open circles (for a pulse length of 6.6 μs) to about 40° and the open squares (for a pulse length of 4.4 μs) to about 25°, all flip angle values given being the actual rather than effective values.

It can be deduced from the figure that, up to about 3 ms, signal intensity reduces in proportion to the flip angle, to a first approximation, as would be expected if only a single pulse were used.

Figure 7:
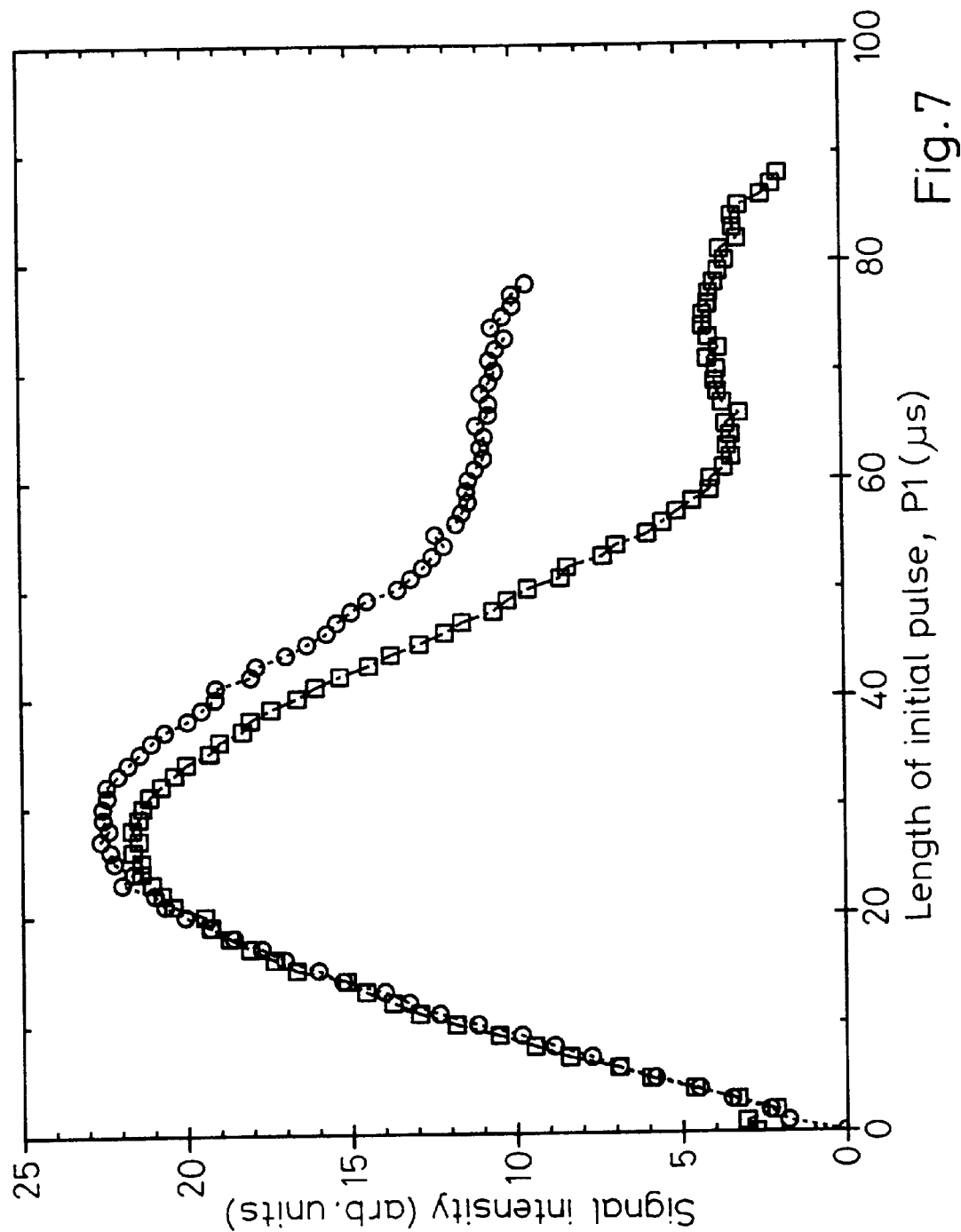
FIG. 7 is a plot of signal intensity versus the length of the initial pulse, P1, illustrating a comparison between two different types of pulse.

FIG. 7 illustrates the same point in a different manner. In the figure, the open circle symbols represent the signal intensity following a single P1 pulse for different lengths of this pulse; the open square symbols represent the signal intensity following a spin locking sequence of a P1 pulse of variable length and a pulse P2 of fixed length 100 μs.

It can be seen that, within limits, the signal intensity following the spin locking sequence depends on the length of the initial P1 pulse in roughly the same way as that following a single P1 pulse in isolation. This suggests that if it is possible to observe a free induction decay, it should be equally possible to observe a spin locking response of roughly the same intensity, irrespective (within limits) of the values of $B_1$ or flip angle.

Figure 8:
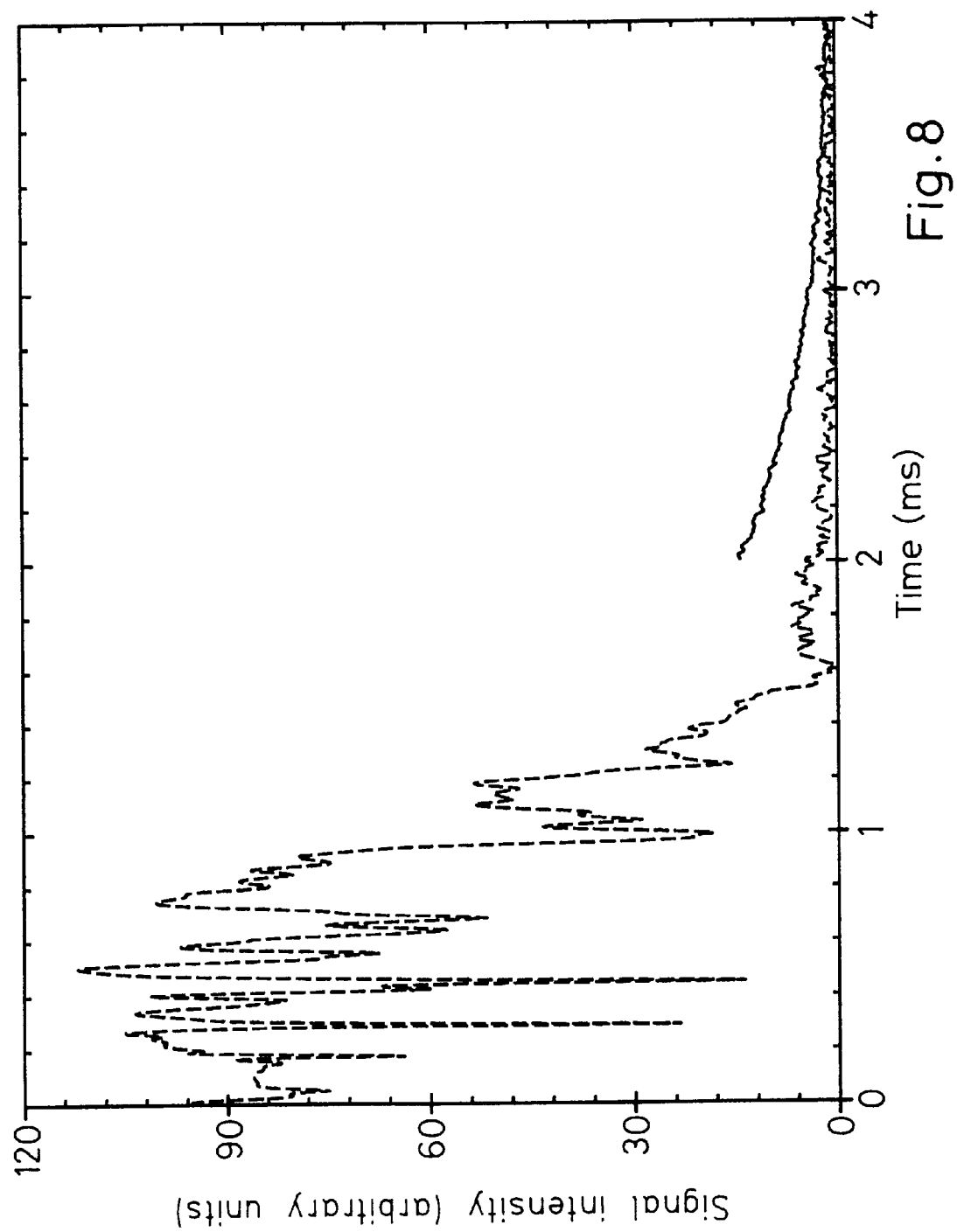
FIG. 8 is a plot of signal intensity versus time derived using a second variant of the first embodiment.

This point is demonstrated in FIG. 8, which shows the response for a sample comprising both sand and the explosive RDX. The fully phase cycled (second) variant of the first embodiment was employed, with a spin lock of 2 ms. The plot of signal intensity versus time illustrates firstly how large the sand signal (denoted by the dashed line and determined using just an equivalent single pulse) is, but secondly that, if the true NQR signal is only sampled after 2 ms, that this will be significantly greater than the sand signal (sec the full line).

It is to be noted that the above results have been presented for the on-resonant performance of the spin locking sequence. The sequence can function almost as successfully at off-resonant conditions over a limited bandwidth, especially where the version of the pulse sequence shown in FIGS. 2(b)(i) and (ii), 2(c)(i) and (ii), and 2(d)(i) and (ii) is employed.

Figure 9:
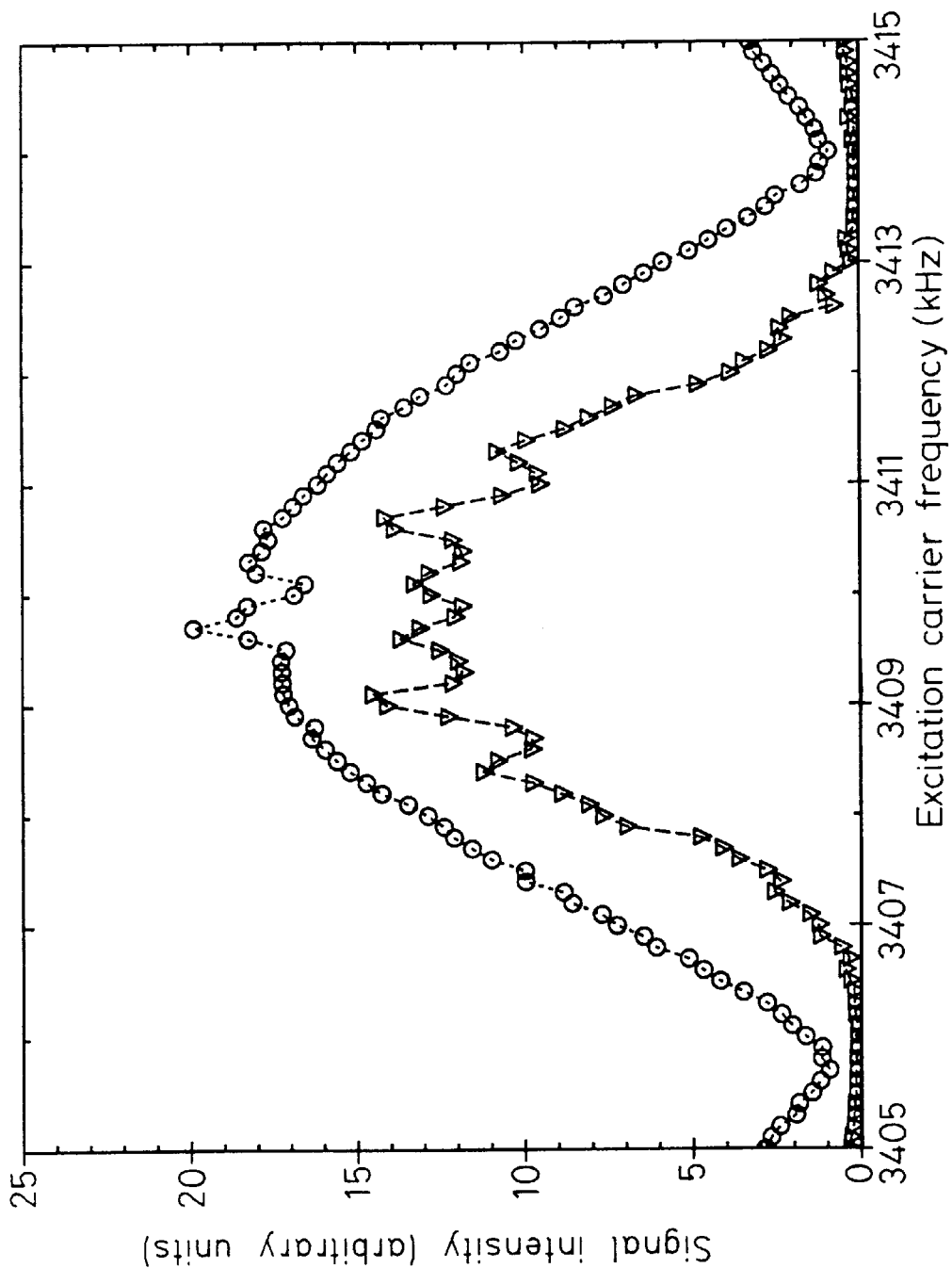
FIG. 9 is a plot of signal intensity versus frequency derived using a third variant of the first embodiment, compared with a similar plot derived using a single excitation pulse.

Referring now to FIG. 9, again using as a sample the explosive RDX at 3.41 MHz, there is shown by the triangular symbols the results of summing the responses to the phase split pulse sequences shown in FIGS. 2(c)(i) and (ii), 2(d)(i) and (ii) and described as the third variant of the first embodiment, and then dividing this result by two, whilst stepping the excitation carrier frequency through 0.1 kHz increments. The preparatory pulse was of length 240 μs, whilst each of the eight phase split pulses were of length 275 μs, making a total pulse sequence length of nearly 25 ms. By the circular symbols is shown the results of a similar single pulse of length 240 μs, again stepping the carrier frequency through 0.1 kHz increments. It will be seen that the signal intensity for the phase split pulse sequences is at least 70% of that for the single pulse, whilst the bandwidth of 35 kHz is roughly similar. This bandwidth represents a temperature variation of 38° C., demonstrating the good off resonance properties of the split pulse sequence.

Figure 10:
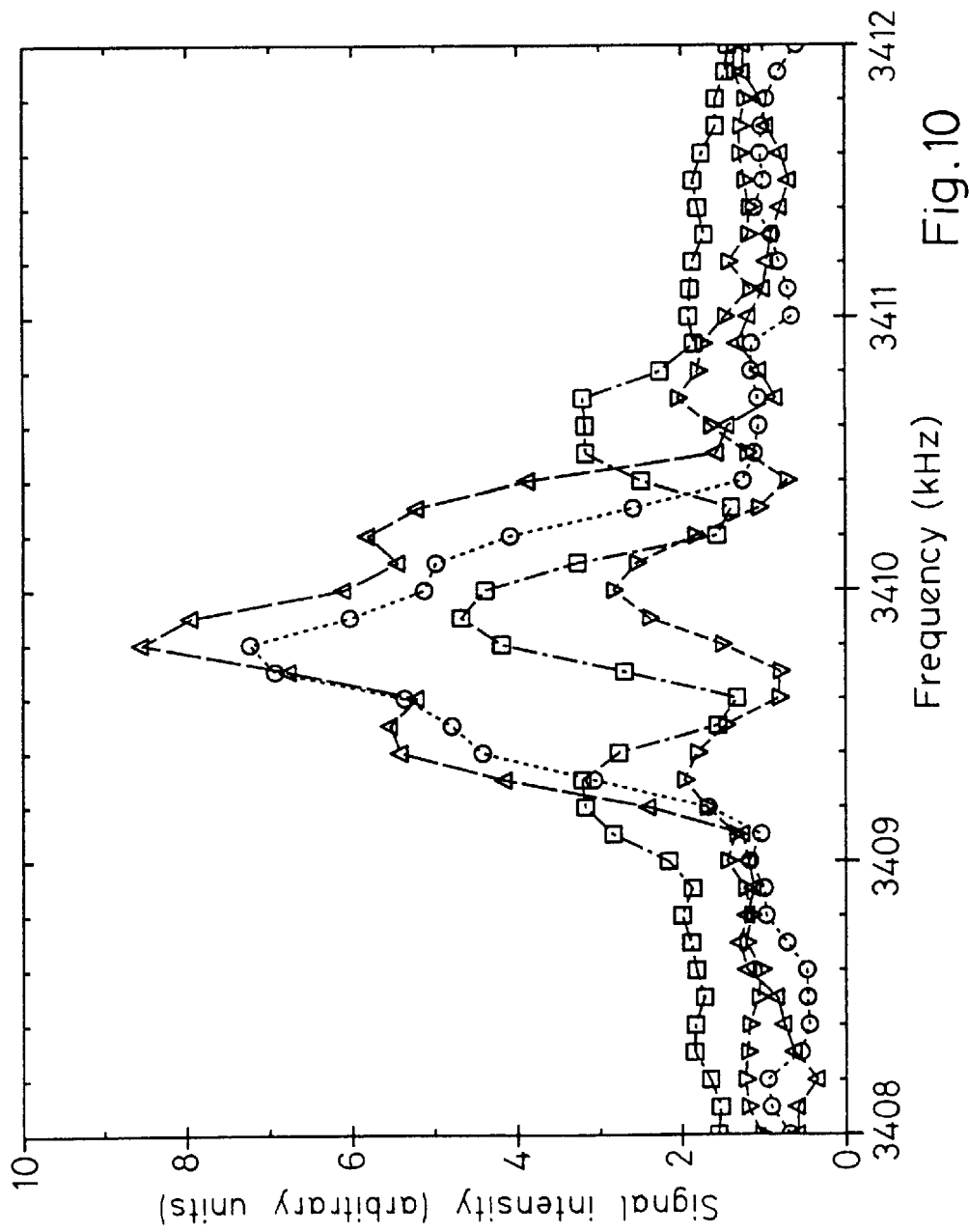
FIG. 10 is a plot of signal intensity versus frequency derived using first and fourth variants of the first embodiment.

Referring now to FIG. 10, again using as a sample the explosive RDX at 3.41 MHz, there are shown the results of using stacked pulses (described as the fourth variant of the first embodiment), by comparison with the basic spin locking sequence described as the first variant. In all four cases illustrated in FIG. 10 the spin lock was of the same duration (1 ms). As would be expected, the best results, both in terms of peak response and bandwidth, are obtained with a stacked pulse having $t_B=t_A/2$ (=250 μs) and n=3 (sec the upright triangular symbols). The second best results are obtained with a stacked pulse having $t_B=t_A$ (=250 μs) (see the circular symbols). The square data points were obtained with the basic spin locking sequence with the pulse length of the preparatory pulse equal to 250 μs. The inverted triangle data points were obtained with the basic spin locking sequence with the pulse length of the preparatory pulse equal to 125 μs.

Second Embodiment—Multiple Pulse Echo Techniques

In a second preferred embodiment of the invention, in brief the interfering signals are removed by means of multiple pulse echo techniques.

With the second embodiment, the same principle of phase equivalence as was described above is used to remove spurious interfering signals from NQR echoes. Also the principle of reversing the phase of the initial, preparation pulse from sequence to sequence is generally although not exclusively employed.

Signal to noise ratio can be improved by repeated accumulations of echoes, as is customary not only with the Pulsed Spin Locking sequence referred to in the first variant of the second embodiment (see below), but also with the Carr-Purcell-Meiboom-Gill (CPMG) sequence as well as with the Strong Off Resonant Comb and Steady State Free Precession sequences mentioned in U.S. Pat. No. 5,365,171 referred to previously (which may in any event be viewed as Pulsed Spin Locking sequences). Hence "n" in the relevant pulse sequences may advantageously be as large as possible, perhaps between 10 and 50 or 15 and 25, or else larger still.

Not only the Pulsed Spin Locking sequence but also the Strong Off Resonant Comb and Steady State Free Precession sequences just mentioned have been found to be able to generate echoes in the presence of line broadening due, for example, to temperature variations in the sample, and to function at low values of $B_1$. Hence all of these sequences may be employed successfully with the present invention, in combination where appropriate with the relevant initial preparation pulse as described herein. Indeed, yet other pulse sequences following the initial preparation pulse may alternatively be employed, with little restriction on the type of sequence, given the versatility of the technique of the present invention. A number of useful pulse sequences are described later as variants of the second embodiment.

The second preferred embodiment of the invention advantageously uses the phase cycling techniques discussed in relation to the first embodiment, and in particular the two or four pair sequences shown in the first two tables above, with the pulses further to the P2 pulse in each individual sequence taking the same phase as the P2 pulse.

First variant of the second embodiment—Pulsed Spin Locking pulse sequence

Figure 11:
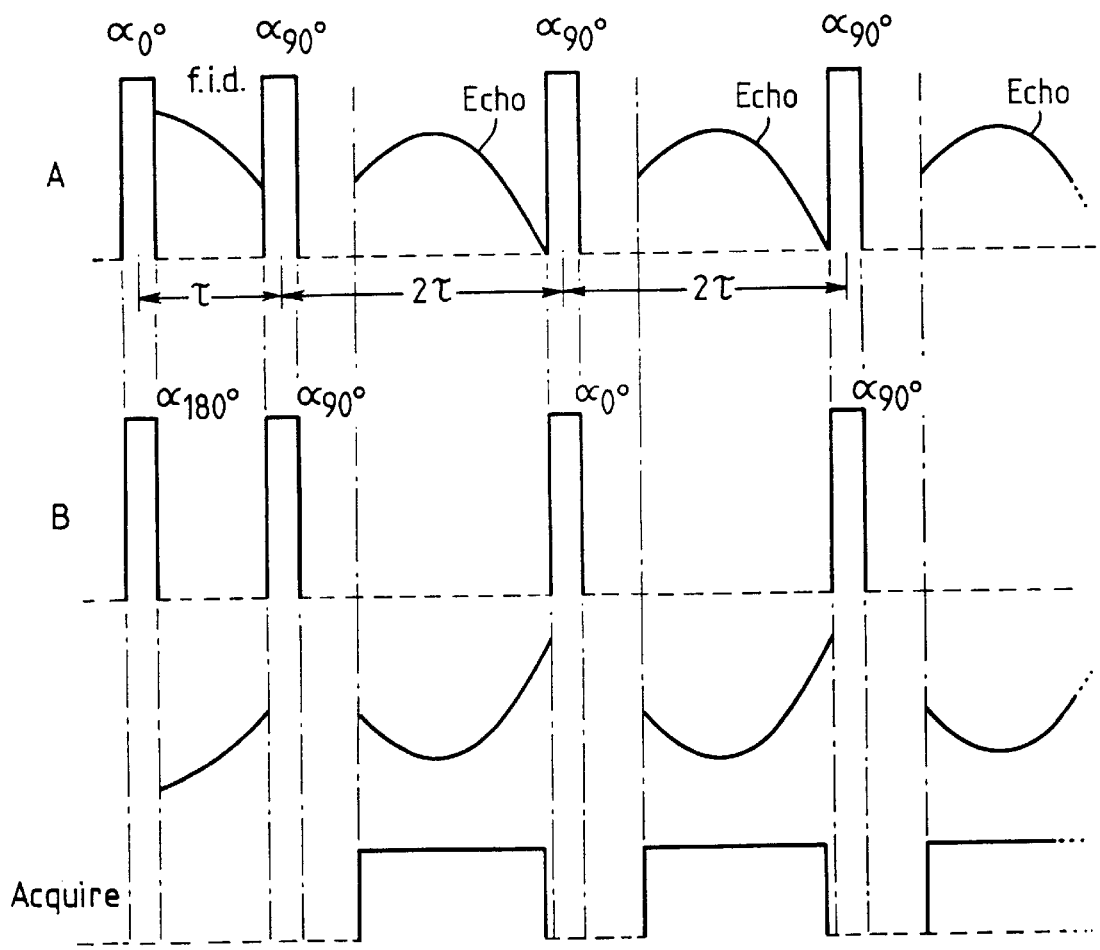
FIG. 11 is a pulse timing diagram for use with a second preferred embodiment of the present invention.

With reference first to FIG. 11, an on-resonant Pulsed Spin Locking (PSL) "A" sequence of the form:

$$\alpha_{0°}-\tau-\alpha_{90°}-\{-2\tau-\alpha_{90°}-\}_n$$

is alternated with a similar "B" sequence of the form:

$$\alpha_{180°}-\tau-\alpha_{90°}-\{-2\tau-\alpha_{90°}-\}_n$$

where the time τ is the separation between the initial pulse and the next pulse in the sequence, and the time 2τ is termed the "pulse repetition time" for the remaining pulses.

It is noted that a PSL sequence uses the spin locking technique referred to previously.

As shown in the figure, acquisition of the response signal takes place between each of the $\alpha_{90°}$ pulses, but not directly after the initial (P1) $\alpha_{0°}$ or $\alpha_{180°}$ preparation pulses. In fact, acquisition is delayed somewhat even after the second (P2) pulses, to take account of instrumental ring down. In the sequences, n may take any appropriate value (including 1 or even 0 if only a short echo sequence is desired).

The two sequences are subtracted one from the other in a phase shifting technique analogous to that described above, to yield an echo response signal substantially free from interfering signals or indeed free induction decay signals.

Second variant of the second embodiment—Steady State Free Precession pulse sequence In the second variant of the second embodiment of the present invention a number of Steady State Free Precession echo generating pulse sequences are disclosed; not all of these sequences use initial preparatory pulses, but they all still comply with the principle of phase equivalence.

In the first and simplest (non-spin locking) pulse sequence, a four pulse multiple pulse sequence with 180° phase shifts is employed:

$$\left\{\alpha_{0°} - \frac{A}{\tau} - \alpha_{0°} - \frac{B}{\tau} - \alpha_{180°} - \frac{C}{\tau} - \alpha_{180°} - \frac{D}{\tau} - \right\}_n$$

where n represents a repetition of the sequence and the angles shown are phases. The signals are combined as (A−B−C+D). This sequence fulfils the principle of phase equivalence in that only like phases are subtracted from one another. Spurious signal cancellation is, as usual, effected by the respective pulses immediately preceding the members of the particular pairs of pulses being compared (A and B, C and D) being of opposite phase.

Phase cycling can be achieved by employing a second sequence in which the 0° phases of the first sequence are replaced by 90° phases, and the 180° phases by 270° phases.

The phase cycled version of the first sequence is analogous to a second, eight pulse multiple pulse sequence with 90° phase cycles:

$$\left\{\alpha_{0°} - \frac{A}{\tau_1} - \alpha_{90°} - \frac{B}{\tau_2} - \alpha_{180°} - \frac{C}{\tau_3} - \alpha_{270°} - \frac{D}{\tau_4} - \right\}_n$$

followed by:

$$\left\{\alpha_{0°} - \frac{E}{\tau_1} - \alpha_{270°} - \frac{F}{\tau_2} - \alpha_{180°} - \frac{G}{\tau_3} - \alpha_{90°} - \frac{H}{\tau_4} - \right\}_n$$

with the following receiver phases A-0°, B-270°, C-180°, D-90°, E-180°, F-270°, G-0° and H-90°. The pulse lengths are preferably identical, and preferably as close as possible to the optimum value of 119° for spin-1 nuclei such as $^{14}$N, but the sequence will function at lower flip angles with some loss of signal-to-noise ratio. The generation of echoes using a flip angle less than optimal is disclosed elsewhere in this patent specification. Being echo-like signals, the response signals are less susceptible to temperature gradients within the sample than would be free induction decay signals. This second sequence is particularly preferred; it functions especially well at low $B_1$ field.

No phase cycling is normally necessary with the eight pulse sequence just described. It will nevertheless be appreciated that further sequences would use the same phases in different permutations.

The pulse separations $\tau_1$, $\tau_2$, $\tau_3$ and $\tau_4$ need not be equal; if they are equal, the signal responses appear in the form of echoes peaking at the subsequent pulse, which is a disadvantage from the signal-to-noise ratio point of view. The echo maximum can be displaced into a more accessible region by allowing the pulse separations to differ, and hence generate stimulated or like echoes, as taught in our earlier United Kingdom Patent No. 2,262,610 (to British Technology Group Limited). A simple but effective choice is to use just two separations with $\tau_2=2\tau_1$, $\tau_3=\tau_1$ and $\tau_4=\tau_2$, but other combinations are possible, and more than two or three different pulse separations may be employed.

In a first sub-variant of the third variant presently described, each pulse in the sequence is replaced by a pair of identical pulses. For instance, the first half of the eight pulse sequence described above would be as follows:

$$\{\alpha_{0°}\text{-}\tau\text{-}\alpha_{0°}\text{-}\tau_1\text{-}\alpha_{90°}\text{-}\tau_2\text{-}\alpha_{90°}\text{-}\tau_1\text{-}\alpha_{180°}\text{-}\tau_2\text{-}\alpha_{180°}\text{-}\tau_1\text{-}\alpha_{270°}\text{-}\tau_2\text{-}\alpha_{270°}\text{-}\}_n$$

which also functions well with $\tau_2=2\tau_1$. This sub-variant can enhance signal to noise ratio.

In a second sub-variant of the third variant, a specific sequence of the form:

$$\{\alpha_{90°}\text{-}\tau\text{-}\alpha_{0°}\text{-}2\tau\text{-}\alpha_{180°}\text{-}\tau\text{-}\alpha_{270°}\}\text{Acquire}$$

combined with:

$$\{\alpha_{0°}\text{-}\tau\text{-}\alpha_{180°}\text{-}2\tau\text{-}\alpha_{90°}\text{-}\tau\text{-}\alpha_{270°}\}\text{Acquire}$$

also functions well. It has particular benefits at low $B_1$ field, under which condition it can enhance magnetization and hence signal.

In a third sub-variant, the basic eight pulse sequence with 90° phase shifts is collapsed into a pair of individual composite spin locking stacked pulse sequences (see the first embodiment), for example:

$$\{\alpha_{0°}\text{-}\alpha_{90°}\text{-}\alpha_{180°}\text{-}\alpha_{270°}\}_n$$

$$\{\alpha_{180°}\text{-}\alpha_{90°}\text{-}\alpha_{0°}\text{-}\alpha_{270°}\}_n$$

The first pulse in each individual sequence effectively acts as a preparatory pulse, the second to effect some spin locking, the third to effect phase reversal, and the final pulse to effect spin locking. The individual sequence may generate an echo as well as a free induction decay.

The third sub-variant may be used either by itself or as part of another sequence. Each individual stacked pulse sequence could for example form a single pulse in the eight pulse sequence described above.

The third sub-variant has a good overall performance especially at higher $B_1$ field provided that the spin-locking time $T_{1\rho}$ is longer than the overall pulse length; because this is a "long" pulse, its excitation bandwidth can be narrow.

In a fourth sub-variant, each pulse of the basic eight pulse sequence may be replaced by a two (or more) pulse stacked-type spin locking sequence, for example with $\tau_2=2\tau_1$:

$$\{\alpha_{0°}\text{-}\alpha_{90°}\text{-}\tau_1\text{-}\alpha_{90°}\text{-}\alpha_{180°}\text{-}\tau_2\text{-}\alpha_{180°}\text{-}\alpha_{270°}\text{-}\tau_3\text{-}\alpha_{270°}\text{-}\alpha_{0°}\text{-}\tau_4\text{-}\}_n$$

$$\{\alpha_{180°}\text{-}\alpha_{90°}\text{-}\tau_1\text{-}\alpha_{90°}\text{-}\alpha_{0°}\text{-}\tau_2\text{-}\alpha_{0°}\text{-}\alpha_{270°}\text{-}\tau_3\text{-}\alpha_{270°}\text{-}\alpha_{180°}\text{-}\tau_4\text{-}\}_n$$

with the same combination of response signals being taken as described in relation to the basic eight pulse sequence. Usually, the second, spin locking pulse in the spin locking sequence would be of roughly the same length as the preparatory pulse. The pulse sequence of the third sub-variant can enhance magnetization at low $B_1$ field. The sequence can generate both echoes and free induction decays, with the latter predominating when longer spin locking pulses are employed. Signal acquisition can be adjusted to detect either echoes or f.i.d's or both.

In a fourth sub-variant, longer pulse sequences than the basic four or eight pulse sequence described above may be employed, using additional pulses at intermediate phases (such as 45° and odd multiples thereof). It is however doubtful whether such pulse sequences afford any real advantage over the four and eight pulse sequences.

All of the sequences disclosed in this particular variant are capable of generating echoes or echo-like signals at flip angles considerably less than 119°, so enabling long r.f. pulses to be used at low $B_1$ field.

Third variant of the second embodiment—Steady State Free Precession pulse sequence with phase alternation In U.S. Pat. No. 5,365,171, a Steady State Free Precession (SSFP) method is described based on 180° phase shifts, as shown below:

$$PAPS \quad \left\{\alpha_{0°} - \frac{A}{\tau_1} - \alpha_{180°} - \frac{B}{\tau_2} - \right\}_n$$

-continued $$NPAPS \quad \left\{ \alpha_{0°} - \overset{C}{\tau_1} - \alpha_{0°} - \overset{D}{\tau_2} - \right\}_n$$

All the values of pulse separation, τ, are identical (that is, $\tau_1=\tau_2$); the subscript n implies an appropriate repetition of the pulse sequences in order to achieve the requisite signal to noise ratio. The first sequence is referred to as a Phase-Alternated Pulse Sequence (PAPS), the second as a Non-Phase-Alternated Pulse Sequence (NPAPS). It is claimed that the combination (A-B-C-D) produces effective mulling of spurious responses.

However, it has now been discovered pursuant to the present invention that, in the case of the piezoelectric responses from sand, only a relatively modest 20 dB of attenuation is achieved with this technique, and furthermore because of its asymmetry the sequence tends to produce a large signal off-set, dependent on adjustment of the spectrometer. The reason for these drawbacks is the failure of the PAPS/NPAPS sequence to fulfil exact phase equivalence, that is, as regards phases, the principle that like should be subtracted from like, since the sequence involves three 0° phases but only one 180° phase.

According to the present invention, a revised version of this sequence which does fulfil the phase equivalence principle has been developed. This is shown below:

$$PAPS \quad \left\{ \alpha_{0°} - \overset{A}{\tau_1} - \alpha_{180°} - \overset{B}{\tau_2} - \right\}_n$$

$$PAPS \quad \left\{ \alpha_{180°} - \overset{C}{\tau_1} - \alpha_{0°} - \overset{D}{\tau_2} - \right\}_n$$

$$NPAPS \quad \left\{ \alpha_{0°} - \overset{E}{\tau_1} - \alpha_{0°} - \overset{F}{\tau_2} - \right\}_n$$

$$NPAPS' \quad \left\{ \alpha_{180°} - \overset{G}{\tau_1} - \alpha_{180°} - \overset{H}{\tau_2} - \right\}_n$$

and the combination to take is now (A−C−E+G), or, more fully, (A−C−E+G−B+D+H). Such a pulse sequence has been found experimental to produce 33 dB attenuation of the sand response, with no off-set. This performance is comparable with the best achievable by the other variants of the second embodiment.

Performance is further enhanced by carrying out a phase cycled version of the sequence, in which the 0° phases are converted into 90° phases, whilst 180° phases are converted into 270° phases.

Furthermore, in our revised version of this sequence, it is possible to have $\tau_1$ different from $\tau_2$, which would be difficult if not impossible to implement for the method described in U.S. Pat. No. 5,365,171 in view of its inherent asymmetry. Having $\tau_1$ different from $\tau_2$ can have advantages in enhancing the signal to noise ratio, as described above in relation to the second variant of the second embodiment.

General considerations for the second preferred embodiment

Various conditions are preferably fulfilled, and various features preferably provided, if the second embodiment of the present invention is to function satisfactorily. These are as follows.

Firstly, one particular important feature of the sequences is that signal acquisition is delayed after the initial pulse sufficiently to substantially filter out any interfering signal generated by that initial pulse.

Preferably in the second embodiment, the relevant pulse repetition time τ is typically set greater than 200, 400, 500, 600, 700, 1000 or 1500 μs, analogous to the delay technique discussed above in relation to the first embodiment.

Alternatively, based on the same principle of delayed signal acquisition, the timer is set at typically less than even 200 μs, but signals from the echoes are only detected after the first few (say, two, five, ten or greater) pulses of the sequence, the total delay still being arranged to be greater than the values of 200, 400, 500, 600, 700, 1000 or 1500 μs just mentioned. In this variant suitably a large number of pulses would be used in close succession to each other in each individual A and B sequence. The advantage of this alternative is that it may enhance signal to noise ratio. For instance, the echo decay time, $T_{2e}$, in an on-resonant PSL sequence depends on the pulse repetition time 2τ as $\tau^{-n}$, where "n" lies between 3 and 5, so that fast pulsing can produce the best signal to noise ratio; analogous principles apply to off-resonant PSL sequences.

All the remaining principles concerning the delay as discussed above in relation to the first embodiment can also be applied to the second embodiment.

Secondly, a further important condition to be preferably fulfilled concerns the dependence of the echo intensities on both flip angle α and pulse separation τ, and the inter-relationship between the two. The findings made pursuant to the present invention are as follows. Firstly (as discussed more fully elsewhere) it has been discovered that echoes can be generated at flip angles well below $119°_{actual}$; it may actually be advantageous to generate echoes at low flip angle. Secondly the echo signal intensity has been found to decrease significantly at lower flip angle. Thirdly, however, it has been discovered that reducing the value of the pulse separation τ can to an extent offset the decrease of signal intensity with flip angle, since, it has been found, signal intensity is inversely related to pulse separation. Specifically, it is preferred that the pulse separation τ is less than the free induction decay time, $T_2^*$, of the relevant nuclear species, and more preferred that τ is less than 0.5, 0.3 or even 0.1 times the free induction decay time, $T_2^*$. In this regard τ is in fact most advantageously as small as possible.

Thirdly, a condition for the generation of echoes is that the relevant pulse repetition time, which as used herein for some variants may be equal to 2τ, is in any event less than roughly 5 or 10 times $T_2^*$. For the 3.41 MHz line of RDX, therefore, echoes will be generated if the relevant pulse repetition time is less than roughly 3.5 or 7 ms.

Fourthly, care needs to be exercised in the proper detection of the response signals from echo-generating sequences. At higher values of pulse repetition time (near 5 or 10 times $T_2^*$ or more), most of the magnetization may be concentrated in free-induction-decay type signals which follow or precede a pulse, and so it is this portion of the signal which is preferably detected. At lower values (say, below a pulse repetition time equal to once or twice $T_2^*$), most of the magnetization eventually becomes concentrated in the echoes or in quasi-stationary steady state type signals, and so a different portion of the signal is preferably detected. At intermediate values of pulse repetition time, both signals may be important, and hence careful adjustment of the receiver phase needs to be effected to ensure optimal signal recovery. If, due to limitations in the testing apparatus being used, the probe ring down time prevents the successful acquisition of free induction decay signals at these intermediate values, then it will be necessary to detect only the echo response signals.

Fifthly, since all the variants of the second embodiment can generate echo-type responses, pulse shaping can be used with frequency and or amplitude modulation, provided that the pulses produced do indeed generate NQR echoes. For instance, pulses shaped as described in United Kingdom Patent Publication No. 2,282,666 (to British Technology Group Limited) may be utilised. The advantage of using such pulses is that a better excitation bandwidth can be achieved relative to single rectangular pulses, particularly when restrictions on the $B_1$ field to be used or the r.f. transmitter power available necessitates the use of long pulses. This excitation bandwidth is needed when samples at different temperatures are to be examined, as has been already noted in United Kingdom Patent No. 2,255,830 (to British Technology Group Limited). Frequency changes between pulses may also be used to improve the excitation bandwidth.

A further advantage of using appropriately shaped pulses is that the echo maximum can be shifted so that it no longer falls under the next pulse, and so moves into a more accessible region for capture. The use of stacked, phase split or phase and/or amplitude modulated pulses at low r.f. fields, in combination with unequal pulse spacings (as described earlier) has the additional advantage of increasing the length of echo available for capture.

Sixthly, the echo generating pulse sequences of the second embodiment can be used at low $B_1$ fields to particular advantage. This follows from the discovery made pursuant to the present invention that signal intensity at such low fields is considerably higher than would have been expected.

Seventhly and finally, the signal to noise ratio of the echo-like signals can be further improved by the use of a rising exponential filter, or some other filter based on an increasing function of time matched, for example, to the echo shape, that is to $T_2^*$, given that the spurious interfering signal can be distinguished from the echo signal during the signal capture time in that the former will be decaying whilst the echo signal will be increasing. In one test experiment, signal to noise ratio was increased by nearly 50% by the use of a matched rising exponential filter relative to the spurious signal from a sand sample.

Examples using the second preferred embodiment

Referring to FIGS. 12 to 16, results of various experiments conducted using the first variant of the second embodiment of the present invention (Pulsed Spin Locking pulse sequence) are now presented. Generally, the experiments used a sequence of at least 10 or 15 pulses per individual A or B pulse sequence. Since a four pair phase cycling sequence was used, this meant a minimum of roughly 80 to 120 pulses in total. The spacing between each individual pulse sequence was roughly 60 ms. The spacing would in more general terms be sufficient to allow the magnetization to recover, and so might be more than once, twice, three times or five times $T_1$.

Figure 12:
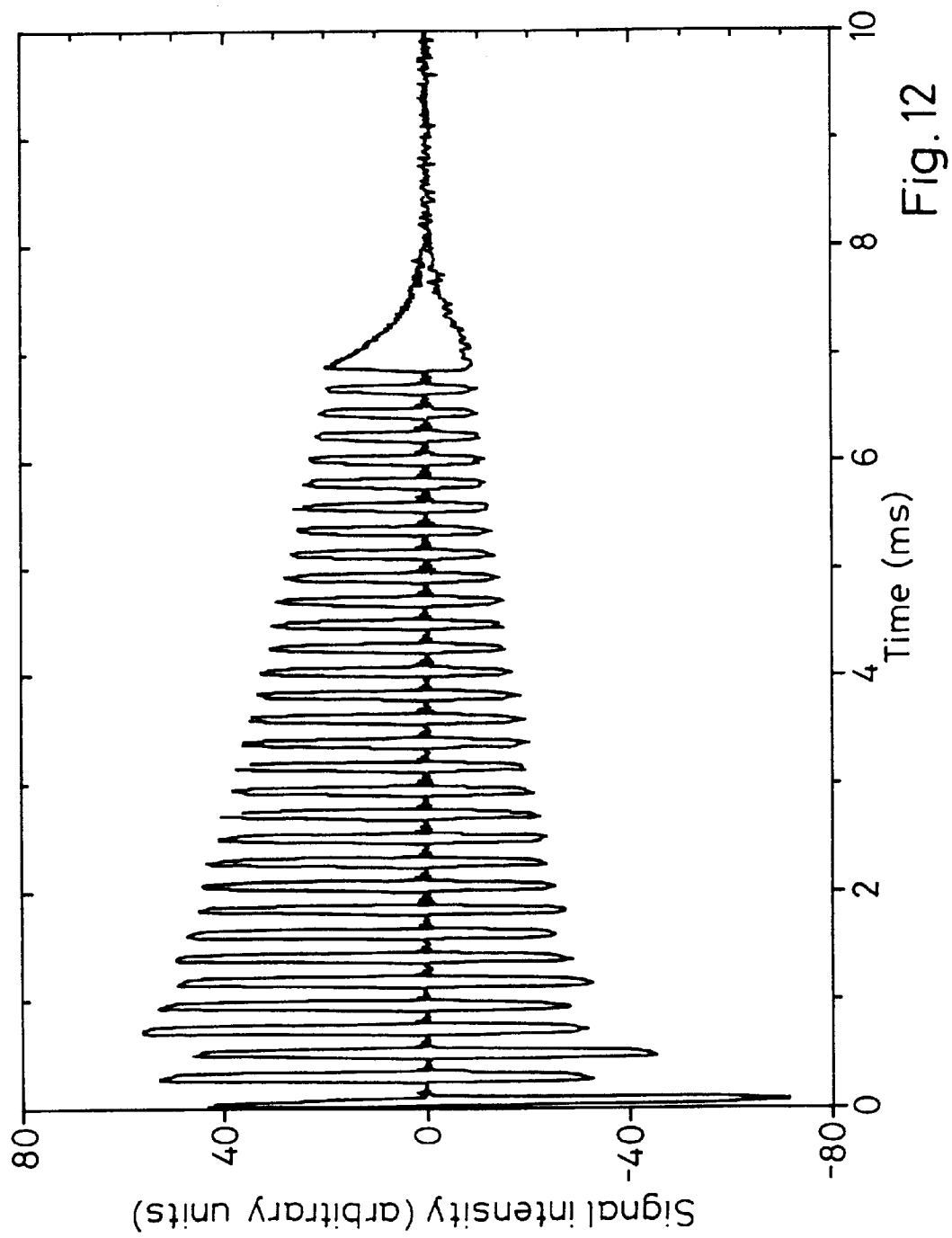
FIG. 12 is a plot of real and imaginary signal intensities versus time derived using a first variant of the second embodiment of the invention.

With reference to FIG. 12, in a first example, 31 PSL pulses per individual pulse sequence were employed (that is, n=31). The figure shows the quadrature detected real and imaginary parts of the multiple echo sequence generated by the 4 pairs of pulse sequences, in which the length of all the pulses was 30 µs, whilst the pulse separation τ=160 µs. Although the intensity of the echo signal diminished over time, at least 31 echoes are observed, and a good quality echo is still visible at 7 ms when the pulse sequences were terminated. It is to be noted that the second, third and further echoes are particularly strong, and it may be advantageous to employ a pulse sequence designed to generate roughly these numbers of echoes.

It is also to be noted from FIG. 12 that the technique has removed all traces of pulse breakthrough caused by the ring down of the probe. A particular advantage of removing the pulse break-through is that the effective ring down time of the probe and receiver system can be shortened, so that data acquisition can commence closer to the edge of the relevant pulse.

Figure 13:
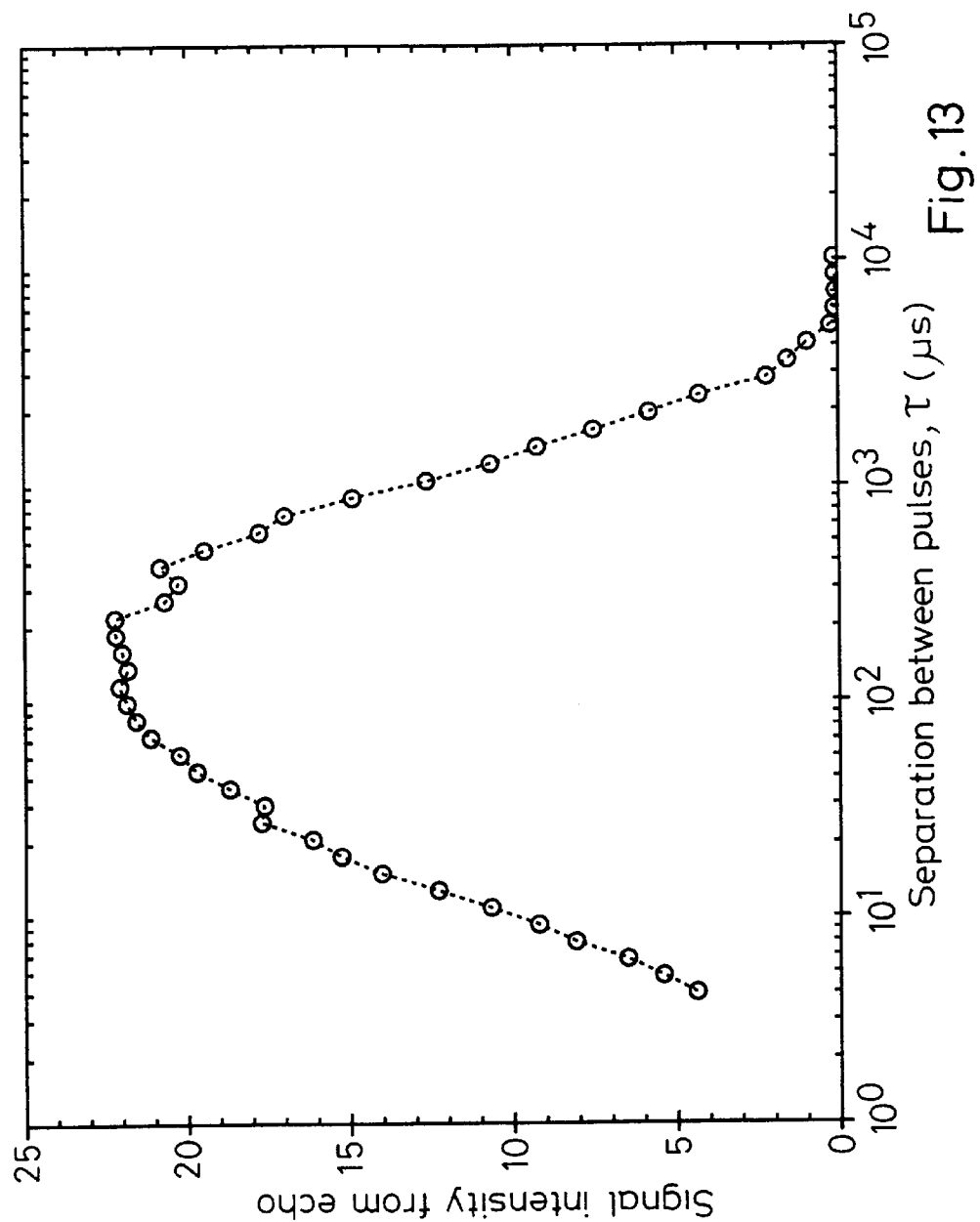
FIG. 13 is a plot of signal intensity versus pulse separation ($\tau$) derived using the first variant.

Reference is now made to FIG. 13, which is a plot of echo signal intensity versus, on a logarithmic scale, pulse separation τ. As with the plot of FIG. 12, the length of all the pulses was 30 µs. In FIG. 13, the first echo was observed following a time of at least 2 ms after the first, initial P1 pulse. The echo signal intensity is observed to vary with the pulse separation τ, reaching a maximum at a value of τ close to 0.3 ms, but, most noticeably, falling sharply at higher values of τ. The free induction decay time, $T_2^*$ for the particular line of RDX being tested was roughly 0.7 ms, and it may be surmised that the sharp fall off above 0.3 ms is caused by inefficient utilisation of the available test time. Further, it can be deduced from FIG. 13 that, within limits, the smaller the value of τ the better. Although signal intensity decreases at lower values, more pulse repetitions can be applied to the sample, and more echoes can be observed, in a given time; this can more than compensate for the lowering of the signal intensity.

As regards the variation of signal intensity with flip angle, in a further example, tests were carried out using a two pair pulse sequence akin to that described above, with the length of the three pulses in each individual sequence being varied between 70 and 250 µs, and the pulse separation τ taking values of 1, 0.5 and 0.25. The echo was sampled after n=1 cycles, with a delay time following the final pulse of 400 µs; the delay time was necessitated by an instrumental restriction, and would normally be very considerably shorter. A pulse length of 250 µs was observed to correspond to a flip angle of $119°_{actual}$, and one of 70 µs was taken to correspond to $33°_{actual}$. The results of these tests are provided in the table below. The final column of the table gives, on the left, the value, in arbitrary units, of the echo intensity for each test, with, on the right, the ratio of the two pairs of echo intensity values for each value of τ.

| P1/µs | P2/µs | τ/ms | Relative echo intensity | |
| --- | --- | --- | --- | --- |
| 250 | 250 | 1 | 3.2 | } ratio: 6.5 |
| 70 | 70 | 1 | 0.49 | |
| 250 | 250 | 0.5 | 4.14 | } ratio: 3.9 |
| 70 | 70 | 0.5 | 1.07 | |
| 250 | 250 | 0.25 | 4.83 | } ratio: 3.4 |
| 70 | 70 | 0.25 | 1.42 | |

The table shows that the integrated echo intensity docs indeed increase as τ decreases, as previously suggested.

Furthermore, reducing the effective flip angle by a factor of 3.6 at constant $B_1$ reduces the integrated echo intensity by a factor varying from 6.5 when τ=1 ms to 3.4 when τ=0.25 ms. It is anticipated that the reduction in integrated echo intensity would be yet less marked at still lower values of τ. In a comparative test, following a single pulse of flip angle 33°, the free induction decay signal intensity was found to reduce relative to that following a pulse of flip angle 119° by a factor of approximately 2.5, much as would be expected from the Bessel function dependence. Hence on the basis of the tests reported above, for an echo sequence a reduction in flip angle below $119°_{actual}$ causes a more significant reduction in signal intensity than for a comparable free induction decay following a single pulse; however, the deficit can be largely recovered if a sufficiently low value of pulse separation τ is utilised.

Whilst the above results have been presented for the on-resonant performance of the PSL sequence, the sequence is believed to function almost as successfully at off-resonant conditions, over a limited bandwidth.

An apparent effect of moving to off-resonant conditions is in many circumstances to shift the echo envelope maximum out in time and somewhat down in intensity. Hence, for off-resonant conditions it may be advantageous to employ a larger rather than smaller number of excitation pulses.

A further effect of moving to off-resonant conditions is that the magnitude of the response signal can vary according to the frequency offset. This may need to be compensated for by careful manipulation of the received signal, or by the Use of excitation at a plurality of discrete frequencies, as taught in International Patent Publication No. WO 92/17794. A further possible solution might be to introduce a small random variation into the pulse repetition time, analogous to the teachings of Freeman and Hill ("Phase and Intensity Anomalies in Fourier Transform NMR", J. Magn. Reson., 4, 366–383 (1971)). This should not alter the strength of the echoes, but only their exact position in time.

Another effect of moving to off-resonant conditions is that the response signal intensity can depend upon whether the frequency offset is positive or negative, more intense signals sometimes being found with a positive frequency offset. This effect may need to be compensated for by skewing the excitation frequency or frequencies to frequencies somewhat lower than the central frequency of the frequency range of interest.

A most important feature of the preferred embodiments of the present invention is their ability to function effectively at low flip angle $\alpha$. Such ability is important in circumstances where there are limitations on the r.f. power which may be applied to the sample.

Figure 14:
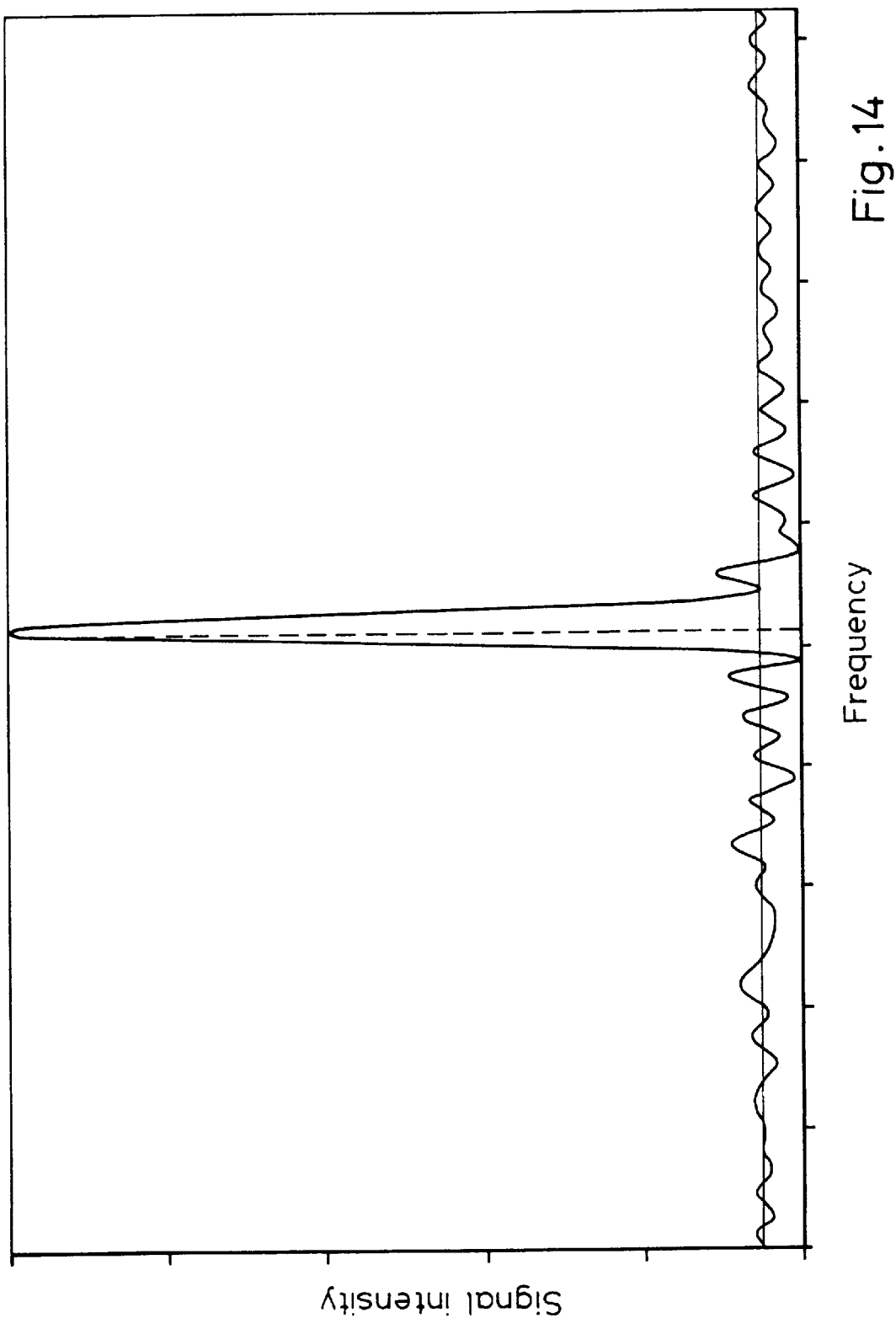
FIG. 14 is a plot of signal intensity versus frequency derived using the first variant, at a first value of flip angle ($119°_{actual}$)
Figure 15:
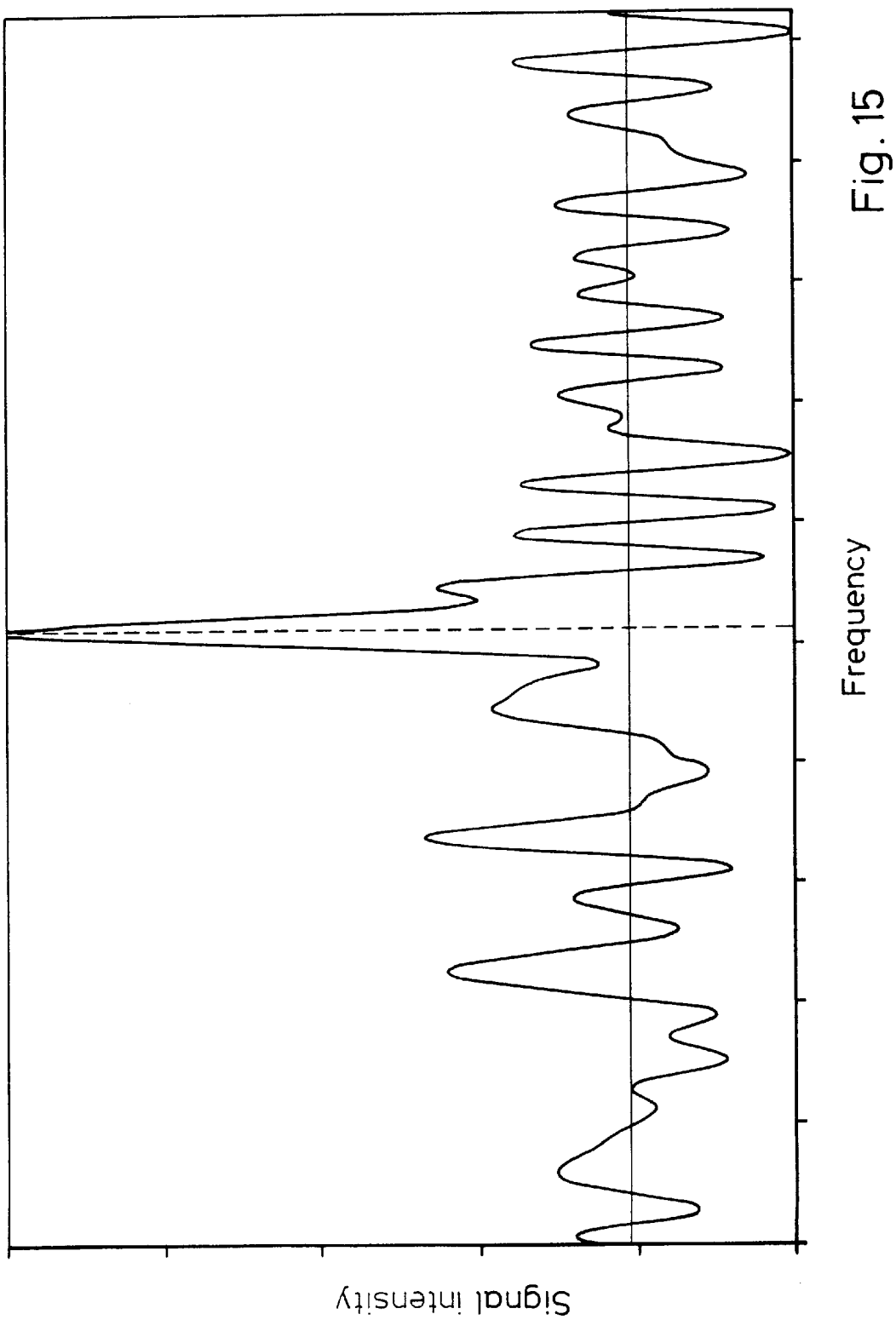
FIG. 15 is the comparable plot at a second value of flip angle ($33°_{actual}$)

The ability to generate echoes at low flip angle is now demonstrated with reference to FIGS. 14 and 15. The conditions in these two figures are respectively as per the conditions in the first two lines of the preceding table; for FIG. 14 the flip angle was $119°_{actual}$ for both the P1 and P2 pulses whilst for FIG. 15 the flip angle was only $33°_{actual}$ for both pulses. In each case, the Pulsed Spin Locking sequence described above was used, with n=1; in other words the echo after the third pulse in the sequence was sampled. In the plots of FIGS. 14 and 15, each sub-division on the horizontal (frequency) axis represents 0.625 kHZ; the 5.192 MHz line of RDX was excited. It can be seen from the figures that echoes were generated under both conditions of flip angle. Indeed, echoes have been generated pursuant to the present invention at flip angles as low as $10°_{actual}$. They have also been generated with the P1 pulse having a flip angle of $90°_{efective}$, but the P2 pulse having a flip angle less than $90°_{effective}$.

Further experiments pursuant to the present invention have demonstrated that the PSL sequence can produce response signals in a so-called "quasi-stationary" state which persist for long periods even at low values of flip angle.

It should also be stated that all of the pulse sequences mentioned above can be used at flip angles above $90°_{effective}$.

As mentioned previously the discovery pursuant to the present invention that echoes could be generated at flip angles of much less than $90°_{effective}$ ($119°_{actual}$ for a spin-1 system) was a surprising discovery. The discovery has also been found to apply to the other pulse sequences described in relation to the second preferred embodiment.

Figure 16:
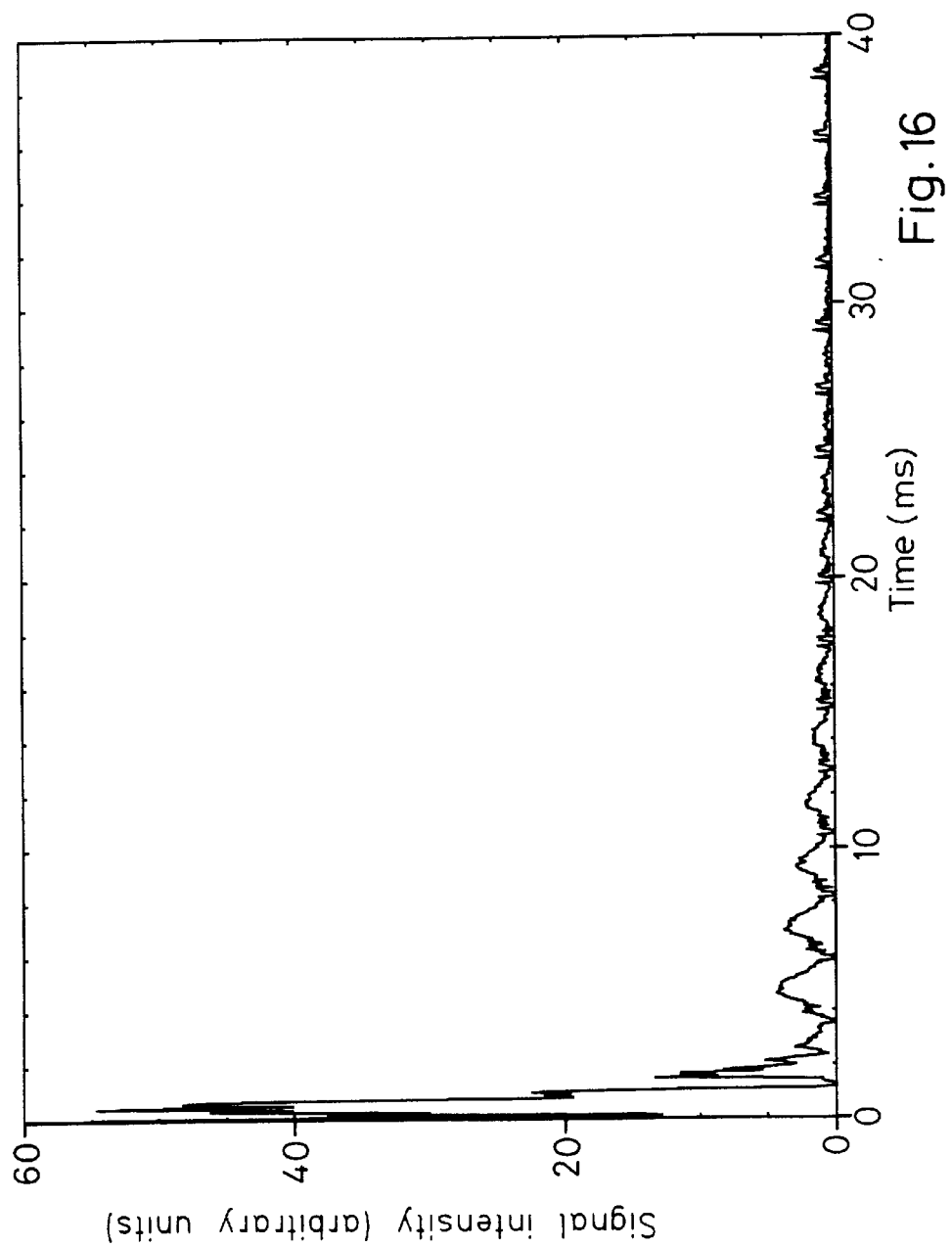
FIG. 16 is a plot of signal intensity versus time derived using the first variant.

Finally in relation to the first variant of the second embodiment, FIG. 16 is a plot of signal intensity against time for a sample comprising the explosive RDX together with Nickel plated screws under typical experimental conditions. The signal from the screws can be seen within the first 1 ms of the test, and no attempt was made to eliminate the signal at this point. Thereafter, however, echo responses are clearly visible without any breakthrough from the spurious response.

Figure 17:
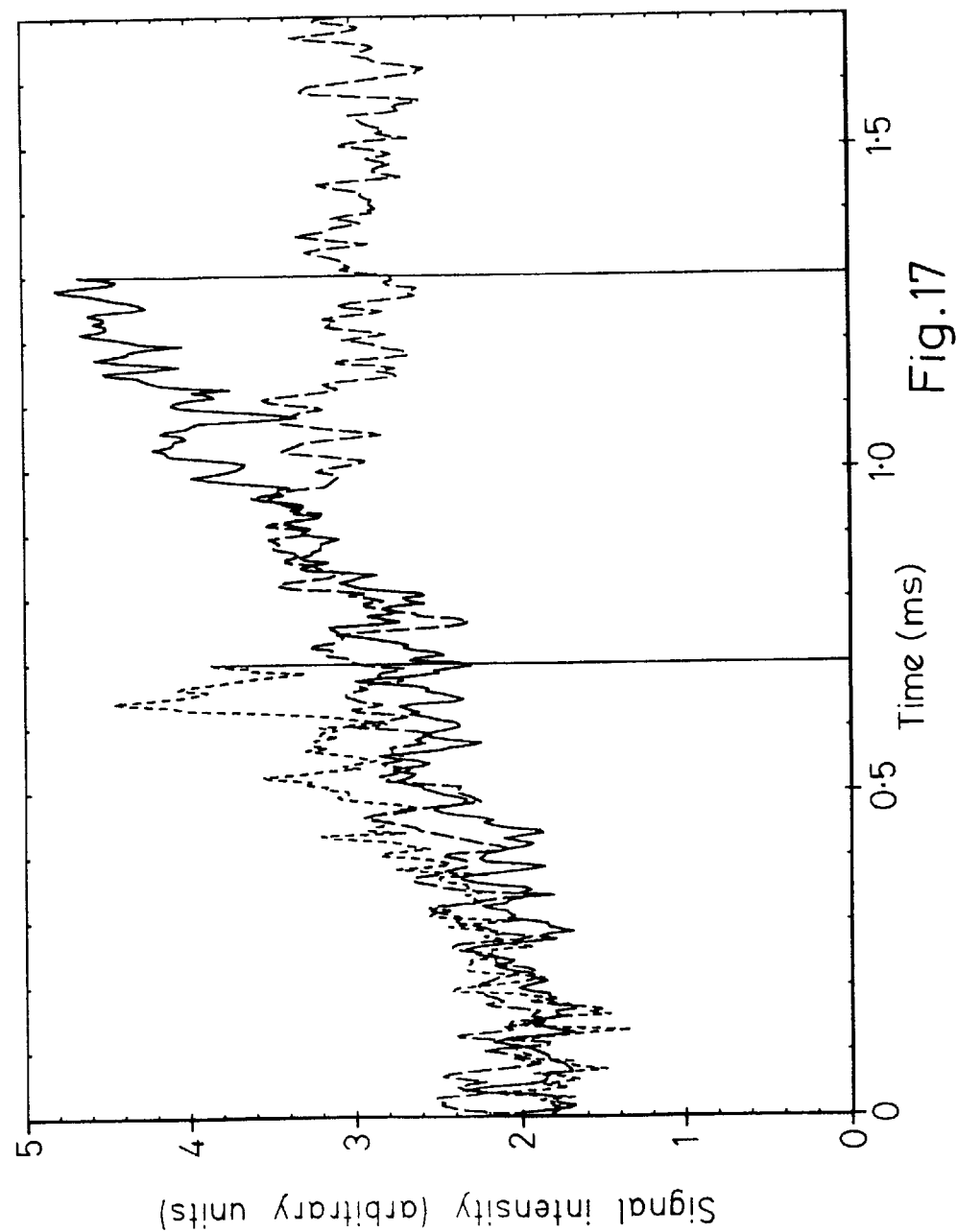
FIG. 17 is a plot of signal intensity versus time derived using a second variant of the second embodiment.

FIG. 17 exemplifies the operation of the eight pulse sequence of the second variant of the second embodiment. The figure is a plot of signal intensity against time using the sequence to detect the NQR signal from the explosive RDX, under the following conditions:

(i) $\tau_1=\tau_2=\tau_3=\tau_4=1.5$ ms (the full line);

(ii) the 1 ms echo obtained during a sequence in which $\tau_1=\tau_2/2=\tau_3=\tau_4/2=1$ ms (the short dashed line); and (iii) the 2 ms echo obtained during the same sequence as in (ii) (the long dashed line).

It will be understood that not all of the echo can be seen in any of the cases.

Integration of the areas under each of the three curves suggests that unequal pulse spacings produce results no worse than those produced with equal spacings. In fact, at lower $B_1$ fields, results have been found to be better using unequal spacings.

Figure 18:
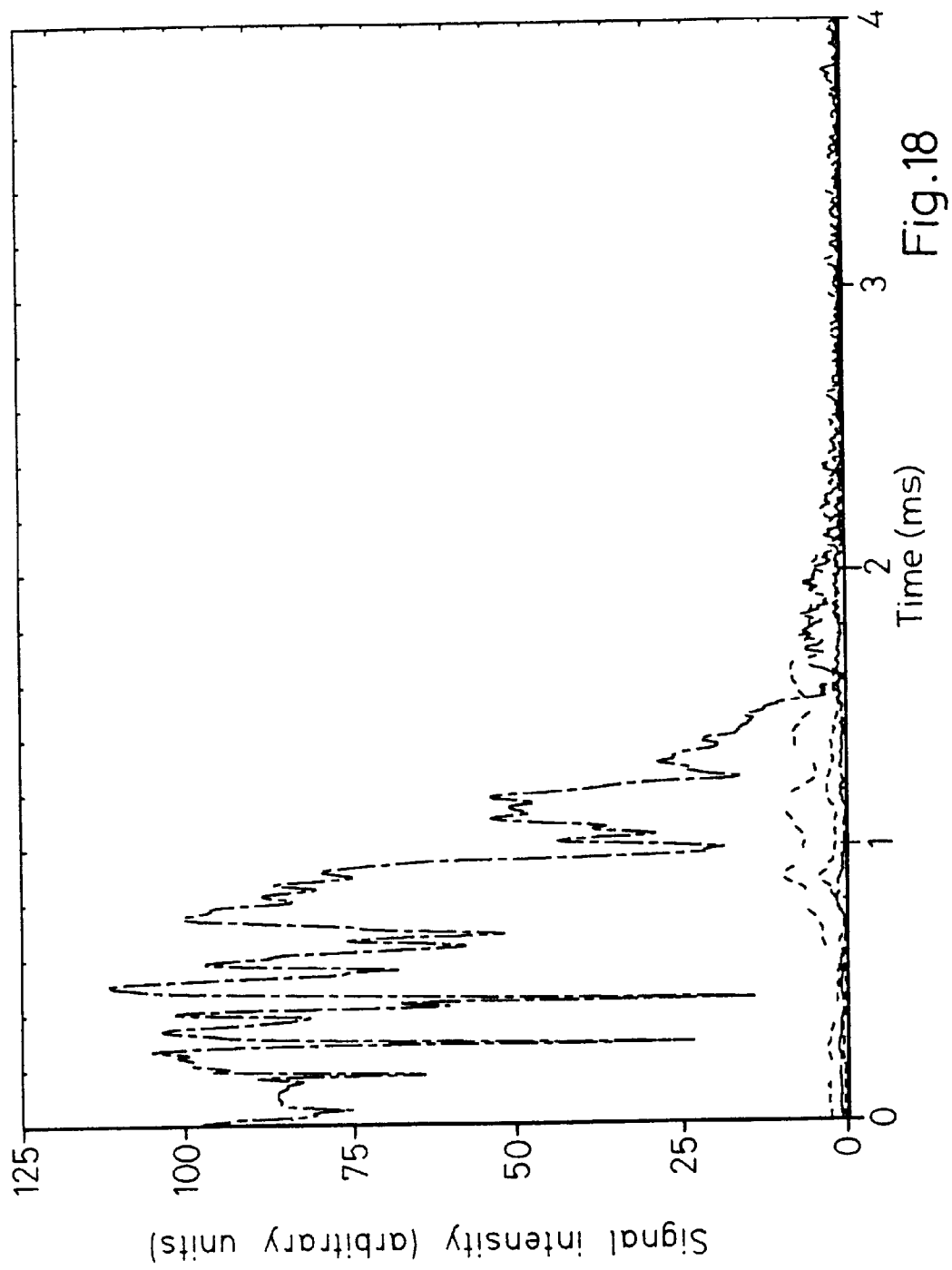
FIG. 18 is a plot of signal intensity versus time derived using the second and a third variant of the second embodiment.

An example of the operation of the second and third variants of the second embodiment (Steady State Free Precession pulse sequences) is now described with reference to FIG. 18. This shows (except for signal (v)) the time evolution of the signal from sand (in the absence of RDX) in response to an r.f. pulse of centre frequency 3.41 MHz under the following conditions:

(i) the signal following a single optimum flip angle ($90°_{effective}$) pulse (the chain dotted line);

(ii) the signal in response to the equivalent eight pulse sequence of the second variant (the single dashed lines), with a constant pulse repetition time $\tau$ of 1.5 ms;

(iii) the signal in response to the equivalent phase alternated sequence of the third variant (the solid line), with the same value of $\tau$;

(iv) the signal in response to the equivalent PAPS/NPAPS pulse sequence described in U.S. Pat. No. 5,365,171 (the triple dashed line), again with the same value of $\tau$.

Signals (ii) to (iv) were obtained at the end of their respective sequences. With a pulse repetition time of 1.5 ms and a dead time of 0.2 ms, during the pulse sequence signal acquisition actually only occurs over the first 1.3 ms of the signal shown in FIG. 18.

Clearly the plain unattenuated sand signal (i) predominates; of the sequences specifically designed to attenuate the sand signal, the second and third variants ((ii) and (iii)) perform the best, whilst the PAPS/NPAPS sequence (iv) performs rather worse.

Figure 19:
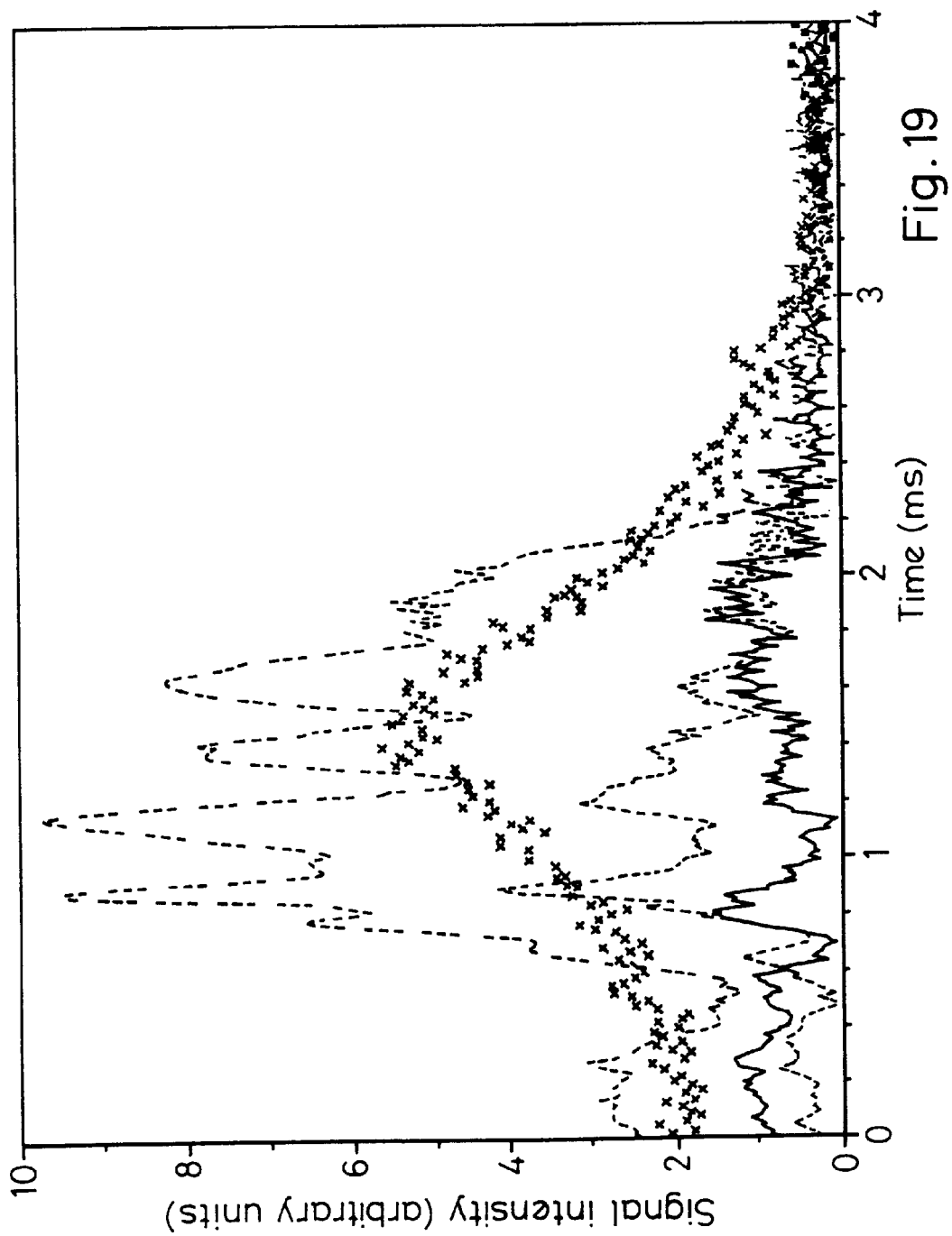
FIG. 19 is a similar plot to that of FIG. 18 to a different scale of signal intensity.

Most of the same information is also shown in FIG. 19, but with the signal intensity being shown to a larger scale (the response to a single pulse not being shown). The same signals are denoted by the same line types. Also shown in FIG. 19 is the signal corresponding to signal (ii) above, but using the explosive RDX instead of sand (the full black symbols).

It can be seen that the results using the second and third variants are roughly equivalent (representing a roughly −33 dB attenuation of the sand signal) whereas the result using the PAPS/NPAPS sequence is considerably worse (representing only a roughly −20 dB attenuation). In comparison the equivalent signal obtained from the explosive RDX in the absence of sand is less intense than the sand signals obtained using the PAPS/NPAPS sequences and signal (i), suggesting that for the particular experimental circumstances used neither a non-phase-cycled sequence nor the PAPS/NPAPS sequence would have detected the RDX. Whilst in general results using the second and third variants have been found to be roughly comparable, often one variant or the other has been found to be marginally more effective for a specific condition. This is thought to be due to the different phases which the two variants employ at various times.

Third Embodiment—Hybrid

A third preferred embodiment of the present invention is effectively a hybrid of the first variants of the previous two embodiments, in that each individual pulse sequence comprises a two-pulse spin locking sequence according to the first embodiment (including the initial, preparation pulse) followed by an echo sequence according to the second embodiment (with no further preparation pulse), with the pulses of the echo sequence being in phase with the P2 pulse, or indeed otherwise having some other phase.

Using the previously used notation, an individual pulse sequence would be of the form:

$$\alpha_{0°}-t_{90°}-\{-2\tau-\alpha_{90°}-\}_n$$

The spin locking sequence is employed to produce a free induction decay signal of respectable quality. This is then regenerated as an echo by the echo sequence, with the phase of the echoes being dictated by the phase of the spin locking sequence. This hybrid sequence can have the advantage over the previously described sequences of improving the signal to noise ratio of the response signal.

In summary in connection with the preferred embodiments of the present invention described above, it can be stated that:

(a) Interfering signals can be removed by suitable phase shifting/phase cycling techniques when compliant with the principle of phase equivalence. A concomitant advantage is that some apparent reduction in the ring down in the probe and receiver system can be achieved by a reduction in pulse break-through.

(b) A phase cycled spin locking sequence can generate free induction decays of comparable intensity to those following a single pulse over a wide range of flip angles, with complete elimination of all spurious ring down effects from the second pulse. In the case of the 3.41 MHz RDX line, spin locking times of between 1 and 2 ms may be preferable, in order to permit full decay of any interfering signal from the first pulse.

(c) A phase cycled sequence can generate echoes with almost complete suppression of all interfering signals from all except the initial preparatory pulse. In the case of the 3.41 MHz line of RDX, the shortest possible pulse spacing seems preferable; a value of $\tau=0.25$ ms produces a loss in integrated echo intensity for a flip angle of $33°_{actual}$ of only 3.4 relative to that of a flip angle of $119°_{actual}$.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. A method of nuclear quadrupole resonance testing a sample containing quadrupolar nuclei, which sample may give rise to spurious signals which interfere with response signals from the quadrupolar nuclei, comprising:

applying a pulse sequence to the sample to excite nuclear quadrupole resonance, the pulse sequence comprising a plurality of pairs of pulses, each of said plurality of pairs of pulses comprising two member pulses;

detecting, for each of said plurality of pairs of pulses, respective response signals following the two member pulses of the pair; and comparing, for each of said plurality of pairs of pulses, said respective response signals following the two member pulses of the pair;

the pulse sequence being such that respective spurious signals following the two member pulses of each of said plurality of pairs of pulses can be at least partially cancelled by the comparison without the corresponding true quadrupole resonance signals being completely cancelled; and for each of said plurality of pairs of pulses, the two member pulses being of like phase.

2. A method according to claim 1 wherein, for at least one of said plurality of pairs of pulses, a respective pulse preceding each member pulse is of differing phase.

3. A method according to claim 1 wherein at least one of said plurality of pairs of pulses is of a first type, and at least one of said plurality of pairs of pulses is of a second type, corresponding to said at least one first type pair, but having cycled phases.

4. A method according to claim 1 wherein, for each of said plurality of pairs, time periods between the respective pulse preceding each member pulse of the pair and the detection in the detection step of the respective response signal following each member pulse of the pair are sufficient for the spurious signals to decay from an initial value to below 50% of said initial value by the end of said time periods.

5. A method according to claim 1 wherein the pulse sequence comprises first and second individual pulse sequences, each sequence including an initial pulse followed, in the case of the first individual pulse sequence, by one respective member pulse of each of said plurality of pairs, and, in the case of the second individual sequence, by the other respective member pulse of each of said plurality of pairs, the initial pulses of the first and second individual sequences differing as to phase.

6. A method according to claim 1 wherein the pulse sequence includes a first pulse and a second pulse, the second pulse at least partially locking magnetization generated by the first pulse.

7. A method according to claim 6, wherein a time between the first pulse and the second pulse is less than one of twice, one, 0.5, 0.3 and 0.1 times the value of $T_2^*$ of the quadrupolar nuclei.

8. A method according to claim 6, wherein the first pulse and the second pulse are contiguous.

9. A method according to claim 6 wherein a duration of the second pulse is less than 5 times the value of $T_{1\rho}$ of said quadrupolar nuclei.

10. A method according to claim 6 wherein the second pulse comprises two phase alternated elements.

11. A method according to claim 10 wherein the second pulse includes a third element having a phase different from said two phase alternated elements.

12. A method according to claim 6 wherein a duration of the second pulse is less than one of 100% of, 75% of, and 50% of, a duration of the first pulse.

13. A method according to claim 12 wherein a phase of a second pulse is in quadrature with a phase of the first pulse.

14. A method according to claim 6 including a third pulse at least partially locking magnetization generated by the first and second pulses, and being of phase intermediate the phase of the first pulse and the phase of the second pulse.

15. A method according to claim 6 wherein at least one of the first and second pulses comprises a plurality of elements of different phase.

16. A method according to claim 6 wherein phases of the first and second pulses are arranged so as to provide together excitation peaks at at least two different frequencies.

17. A method according to claim 1 wherein the pulse sequence comprises at least one pulsed spin locking pulse sequence.

18. A method according to claim 1 wherein the pulse sequence is an echo generating sequence comprising pulses having only relative phases 0° and 180°, and 0°, 90°, 180° and 270°.

19. A method according to claim 1 wherein the pulse sequence comprises at least one individual phase alternated sequence, a first non-phase alternated sequence, and a second non-phase alternated sequence having an alternate phase to the first non-phase alternated sequence.

20. A method according to claim 1 wherein the pulse sequence comprises an echo generating sequence using a flip angle which is exclusively less than $45°_{effective}$.

21. A method according to claim 1 wherein the pulse sequence comprises a plurality of pulses a pulse separation for which is not equal in every case.

22. A method according to claim 1 wherein the pulse sequence comprises a plurality of echo generating pulses so arranged that the echo maxima do not in every case coincide with the pulses.

23. A method according to claim 1 wherein a true quadrupole resonance signal is distinguished from a spurious signal in dependence upon one of its gradient, curvature or shape.

24. A method according to claim 1, wherein the sample comprises a first type substance containing the quadrupolar nuclei and a second type substance which may give rise to the spurious signals.

25. Apparatus for nuclear quadrupole resonance testing a sample which has a first type substance containing quadrupolar nuclei and a second type substance which may give rise to spurious signals which interfere with response signals from the quadrupolar nuclei, comprising:

means for applying a pulse sequence to the sample to excite nuclear quadrupole resonance, the pulse sequence comprising a plurality of pairs of pulses, each of said plurality of pairs of pulses comprising two member pulses;

means for detecting for each of said plurality of pairs of pulses, respective response signals following the two member pulses of the pair; and means for comparing, for each of said plurality of pairs of pulses, said respective response signals following the two member pulses of the pair;

the pulse sequence being such that respective spurious signals following the two member pulses of each of said plurality of pairs of pulses can be at least partially cancelled by the comparison without the corresponding true quadrupole resonance signals being completely cancelled; and for each of said plurality of pairs of pulses, the two member pulses being of like phase.

26. Apparatus according to claim 25 wherein, for each of said plurality of pairs of pulses, a respective pulse preceding each member pulse is of differing phase.

27. Apparatus according to claim 25 wherein at least one of said plurality of pairs of pulses is of a first type, and at least one other of said plurality of pairs of pulses is of a second type, corresponding to said at least one first type pair, but having cycled phases.

28. Apparatus according to claim 25 wherein the pulse sequence comprises first and second individual pulse sequences, each sequence including an initial pulse followed, in the case of the first individual pulse sequence, by one respective member pulse of each of said plurality of pairs, and, in the case of the second individual sequence, by the other respective member pulse of each of said plurality of pairs, the initial pulses of the first and second individual sequences differing as to phase.

29. A pulse sequence for exciting nuclear quadrupole resonance in a sample comprising a first type substance containing quadrupolar nuclei and a second type substance which may give rise to spurious signals which interfere with response signals from the quadrupolar nuclei, the pulse sequence comprising a plurality of pairs of pulses, each of said plurality of pairs of pulses comprising two member pulses, the pulse sequence being such that respective spurious signals following the two member pulses of each of said plurality of pairs of pulses can be at least partially cancelled without the corresponding true quadrupole resonance signals being completely cancelled, and, for each of said plurality of pairs of pulses, the two member pulses being of like phase.

30. A pulse sequence according to claim 29 wherein, for each of said plurality of pairs of pulses, a respective pulse preceding each member pulse is of differing phase.

31. A pulse sequence according to claim 29 wherein at least one of said plurality of pairs of pulses is of a first type, and at least one of said plurality of pulses is of a second type, corresponding to the first type, but having cycled phases.

32. A pulse sequence according to claim 29 wherein the pulse sequence comprises first and second individual pulse sequences, each including an initial pulse followed, in the case of the first individual pulse sequence, by one respective member pulse of each of said plurality of pairs, and, in the case of the second individual sequence, by the other respective member pulse of each of said plurality of pairs, the initial pulses of the first and second individual sequences differing as to phase.

33. A pulse sequence according to claim 29 wherein the pulse sequence comprises at least one pulsed spin locking pulse sequence.

34. A pulse sequence according to claim 29 wherein the pulse sequence is an echo generating sequence comprising pulses having only relative phases 0° and 180°, or 0°, 90°, 180° and 270°.

35. A pulse sequence according to claim 29 wherein the pulse sequence comprises at least one individual phase alternated sequence, a first non-phase alternated sequence, and a second non-phase alternated sequence having an alternate phase to the first non-phase alternated sequence.

36. A pulse sequence according to claim 29 wherein the pulse sequence comprises a plurality of pulses the pulse separation for which is not equal in every case.

37. A method of nuclear quadrupole resonance testing a sample containing quadrupolar nuclei, comprising:

applying a pulse sequence to the sample to excite nuclear quadrupole resonance, the pulse sequence comprising at least a first pulse and a second pulse, a time period between the first and second pulses being less than a duration of the second pulse, said duration of the second pulse being less than 0.5 times the value of $T_{1\rho}$ of said quadrupolar nuclei, the second pulse at least partially locking magnetization generated by the first pulse; and detecting response signals.

38. A method according to claim 37 wherein the second pulse comprises two phase alternated elements.

39. A method according to claim 38 wherein the second pulse includes a third element having a phase different from said two phase alternated elements.

40. A method according to claim 37 wherein said duration of the second pulse is less than one of 100% of, 75% of, and 50% of, a duration of the first pulse.

41. A method according to claim 40 wherein a phase of the second pulse is in quadrature with that of the first pulse.

42. A method according to claim 37, wherein a time between the first pulse and the second pulse is less than one of twice, one, 0.5, 0.3 and 0.1 times the value of $T_2^*$ of the quadrupolar nuclei.

43. A method according to claim 37, wherein the first pulse and the second pulse are contiguous.

44. A method according to claim 37 including a third pulse at least partially locking magnetization generated by the first and second pulses.

45. A method according to claim 44, wherein the phase of the third phase is intermediate the phase of the first pulse and the phase of the second pulse.

46. A method according to claim 37 wherein at least one of the first and second pulses comprises a plurality of elements of different phase.

47. A method according to claim 37 wherein phases of the first and second pulses are arranged so as to provide together excitation peaks at at least two different frequencies.

48. A method of nuclear quadrupole resonance testing a sample containing quadrupolar nuclei, which sample may give rise to spurious signals which interfere with response signals from the quadrupolar nuclei, comprising:

applying a pulse sequence to the sample to excite nuclear quadrupole resonance, the pulse sequence comprising a plurality of pairs of pulses, each of said plurality of pairs of pulses comprising two member pulses;

detecting, for each of said plurality of pairs of pulses, respective response signals following the two member pulses of the pair; and comparing, for each of said plurality of pairs of pulses, said respective response signals following the two member pulses of the pair;

the pulse sequence being such that respective spurious signals following the two member pulses of each of said plurality of pairs of pulses can be at least partially cancelled by the comparison without the corresponding true quadrupole resonance signals being completely cancelled; and for each of said plurality of pairs of pulses, the two member pulses being of like phase;

wherein the member pulses of at least one of said plurality of pairs have different phases from the member pulses of at least one other of said plurality of pairs.

49. Apparatus for nuclear quadrupole resonance testing a sample comprising a first type substance containing quadrupolar nuclei and a second type substance which may give rise to spurious signals which interfere with response signals from the quadrupolar nuclei, comprising:

means for applying a pulse sequence to the sample to excite nuclear quadrupole resonance, the pulse sequence comprising a plurality of pairs of pulses, each of said plurality of pairs of pulses comprising two member pulses;

means for detecting for each of said plurality of pairs of pulses, respective response signals following the two member pulses of the pair; and means for comparing, for each of said plurality of pairs of pulses, said respective response signals following the two member pulses of the pair;

the pulse sequence being such that respective spurious signals following the two member pulses of each of said plurality of pairs of pulses can be at least partially cancelled by the comparison without the corresponding true quadrupole resonance signals being completely cancelled; and for each of said plurality of pairs of pulses, the two member pulses being of like phase;

wherein the member pulses of at least one of said plurality of pairs have different phases from the member pulses of at least one other of said plurality of pairs.

50. A pulse sequence for exciting nuclear quadrupole resonance in a sample having a first type substance containing quadrupolar nuclei and a second type substance which may give rise to spurious signals which interfere with response signals from the quadrupolar nuclei, the pulse sequence comprising:

a plurality of pairs of pulses, each of said plurality of pairs of pulses comprising two member pulses, the pulse sequence being such that respective spurious signals following the two member pulses of each of said plurality of pairs of pulses can be at least partially cancelled without the corresponding true quadrupole resonance signals being completely cancelled, and, for each of said plurality of pairs of pulses, the two member pulses being of like phase, wherein the member pulses of at least one of said plurality of pairs have a different phase from the member pulses of at least one other of said plurality of pairs.

* * * * *